(12) United States Patent
Foust et al.

(10) Patent No.: US 8,822,261 B2
(45) Date of Patent: Sep. 2, 2014

(54) METHODS OF MAKING PHOTOVOLTAIC DEVICES

(75) Inventors: Donald Franklin Foust, Glenville, NY (US); Hongbo Cao, Cohoes, NY (US)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 13/244,971

(22) Filed: Sep. 26, 2011

(65) Prior Publication Data

US 2013/0078757 A1  Mar. 28, 2013

(51) Int. Cl.
*H01L 31/18* (2006.01)
*H01L 31/073* (2012.01)

(52) U.S. Cl.
CPC .............. *H01L 31/073* (2013.01); *Y02E 10/543* (2013.01)
USPC ........... 438/95; 257/E21.485; 438/84; 438/98

(58) Field of Classification Search
CPC .......................... H01L 31/073; Y02E 10/543
USPC .................. 257/E21.485; 438/84, 95, 98
See application file for complete search history.

(56) References Cited

U.S. PATENT DOCUMENTS

| | | | |
|---|---|---|---|
| 4,950,615 A | 8/1990 | Basol et al. | |
| 5,578,502 A | 11/1996 | Albright et al. | |
| 6,111,189 A | 8/2000 | Garvison et al. | |
| 6,548,751 B2 | 4/2003 | Sverdrup, Jr. et al. | |
| 7,179,329 B2 | 2/2007 | Boone et al. | |
| 7,220,321 B2 * | 5/2007 | Barth et al. | 118/729 |
| 8,236,597 B1 * | 8/2012 | Lee | 438/69 |
| 8,247,686 B2 * | 8/2012 | Feldman-Peabody et al. | 136/260 |
| 8,344,243 B2 * | 1/2013 | Lee | 136/256 |
| 8,394,662 B1 * | 3/2013 | Lee | 438/85 |
| 2009/0217973 A1 | 9/2009 | Alivisatos et al. | |
| 2010/0015753 A1 | 1/2010 | Garnett | |
| 2011/0259424 A1 * | 10/2011 | Basol | 136/260 |

FOREIGN PATENT DOCUMENTS

WO  2011133361 A1  10/2011

OTHER PUBLICATIONS

Woodbury et al., "Some Diffusion and Solubility Measurements of Cu in CdTe*", Journal of Applied Physics, Nov. 1968, vol. 39, No. 12, 4 Pages.

Harris et al., "Cation Effect on the Cdse-Liquid Junction", Journal of the Electrochemical Society, Sep., 1993, vol. 140, No. 9, pp. 2581-2588.

(Continued)

*Primary Examiner* — John C Ingham
(74) *Attorney, Agent, or Firm* — MacMillan, Sobanski & Todd, LLC

(57) ABSTRACT

A method of making a photovoltaic device is presented. The method includes disposing an absorber layer on a window layer. The method further includes treating at least a portion of the absorber layer with a first solution including a first metal salt to form a first component, wherein the first metal salt comprises a first metal selected from the group consisting of manganese, cobalt, chromium, zinc, indium, tungsten, molybdenum, and combinations thereof. The method further includes treating at least a portion of the first component with cadmium chloride to form a second component. The method further includes treating at least a portion of the second component with a second solution including a second metal salt to form an interfacial layer on the second component, wherein the second metal salt comprises a second metal selected from the group consisting of manganese, cobalt, nickel, zinc, and combinations thereof.

20 Claims, 16 Drawing Sheets

(56) References Cited

OTHER PUBLICATIONS

Jenkins et al., "CdTe Back Contact: Response to Copper Addition and Out-Diffusion", NCPV and Solar Program Review Meeting, 2003, NREL/CD-520-33586, pp. 900-903.

Potlog et al., "Influence of annealing in different chlorides on the photovoltaic parameters of CdS/CdTe solar cells", Solar Energy Materials & Solar Cells, 2003, vol. 80, pp. 327-334.

Corwine et al., "Copper Inclusion and Migration from the Back Contact in CdTe Solar Cells", Solar Energy Materials & Solar Cells, 2004, vol. 82, pp. 481-489.

Compaan et al., "The Fabrication and Physics of High-Efficiency Cadmium-Telluride Thin-Film Solar Cells", NREL Quarterly Technical Status Report for: Phase 3/Quarter 1, 2004, 9 Pages.

Demtsu et al., "Stability Study of CdS/CdTe Solar Cells made with Ag and Ni Back-Contacts", Solar Energy Materials and Solar Cells, Nov. 2006, vol. 90, Issue 17, pp. 2934-2943.

T. Potlog., "Development of New Techniques of CdS/CdTe Solar Cell Enhancement", IEEE, 2006, pp. 171-174.

Search Report and Written Opinion from corresponding PCT Application No. PCT/US2012/057289 dated Jan. 4, 2013.

Ghosh, "Work function engineering and its applications in ohmic contact fabrication to II-VI semiconductors", vol. 254, No. 15, pp. 4908-4911, May 1, 2008.

Ghosh et al: "Electrical contacts for II-VI semiconducting devices", vol. 86, No. 11, pp. 2187-2206, Nov. 1, 2009.

\* cited by examiner

METHODS OF MAKING PHOTOVOLTAIC DEVICES

BACKGROUND

The invention generally relates to methods of making photovoltaic devices. More particularly, the invention relates to methods of making photovoltaic devices having an absorber layer.

Thin film solar cells or photovoltaic devices typically include a plurality of semiconductor layers disposed on a transparent substrate, wherein one layer serves as a window layer and a second layer serves as an absorber layer. The window layer allows the penetration of solar radiation to the absorber layer, where the optical energy is converted to usable electrical energy. Cadmium telluride/cadmium sulfide (CdTe/CdS) heterojunction-based photovoltaic cells are one such example of thin film solar cells.

Cadmium telluride (CdTe)-based photovoltaic devices typically demonstrate relatively low power conversion efficiencies, which may be attributed to a relatively low open circuit voltage ($V_{oc}$) in relation to the band gap of the material which is due, in part, to the low effective carrier concentration and short minority carrier lifetime in CdTe. Effective carrier concentration of CdTe may be improved by doping with p-type dopants.

Further issues with improving the cell efficiency of CdTe solar cells include the high work function of CdTe and high back-contact resistance at the interface between CdTe and metal-based back contact layer. The back-contact resistance may be improved by increasing the carrier concentration at the back interface. For example, for a p-type CdTe material, increasing the carrier concentration amounts to increasing the p-type carriers in the CdTe material to form an "ohmic contact layer" on the backside of the CdTe layer, which is in contact with the back contact layer.

Typical methods employed to form the ohmic layers or for doping the absorber layer include incorporation of copper into back end of line processing of the absorber layer. However, photovoltaic devices including copper may lack desired levels of long-term stability.

Thus, there is a need for improved methods of making photovoltaic devices. Further, there is a need for improved photovoltaic device configurations having doped absorber layers and higher carrier densities at the back contact interface, resulting in higher efficiencies.

BRIEF DESCRIPTION OF THE INVENTION

Embodiments of the present invention are provided to meet these and other needs. One embodiment is a method of making a photovoltaic device. The method includes disposing an absorber layer on a window layer. The method further includes treating at least a portion of the absorber layer with a first solution including a first metal salt to form a first component, wherein the first metal salt includes a first metal selected from the group consisting of manganese, cobalt, chromium, zinc, indium, tungsten, molybdenum, and combinations thereof. The method further includes treating at least a portion of the first component with cadmium chloride to form a second component. The method further includes treating at least a portion of the second component with a second solution including a second metal salt to form an interfacial layer on the second component, wherein the second metal salt comprises a second metal selected from the group consisting of manganese, cobalt, nickel, zinc, and combinations thereof.

One embodiment is a method of making a photovoltaic device. The method includes disposing an absorber layer on a window layer. The method further includes treating at least a portion of the absorber layer with a dopant solution including a dopant metal salt to form a first component, wherein the dopant metal salt includes a metal dopant selected from the group consisting of manganese, cobalt, chromium, zinc, and combinations thereof. The method further includes treating at least a portion of the first component with cadmium chloride to form a second component, wherein the second component includes a doped absorber layer and wherein the photovoltaic device has an open circuit voltage in a range greater than about 800 mV.

One embodiment is a method of making a photovoltaic device. The method includes disposing an absorber layer on a window layer. The method further includes disposing an interfacial layer on the absorber layer by treating at least a portion of the absorber layer with an ohmic metal solution including an ohmic metal salt, wherein the ohmic metal salt includes an ohmic metal selected from the group consisting of manganese, cobalt, nickel, zinc, and combinations thereof. In one embodiment, the ohmic metal is present in the interfacial layer at a concentration in a range less than about 1 atomic percent of the interfacial layer.

DRAWINGS

These and other features, aspects, and advantages of the present invention will become better understood when the following detailed description is read with reference to the accompanying drawings, wherein.

DETAILED DESCRIPTION

Figure 1:
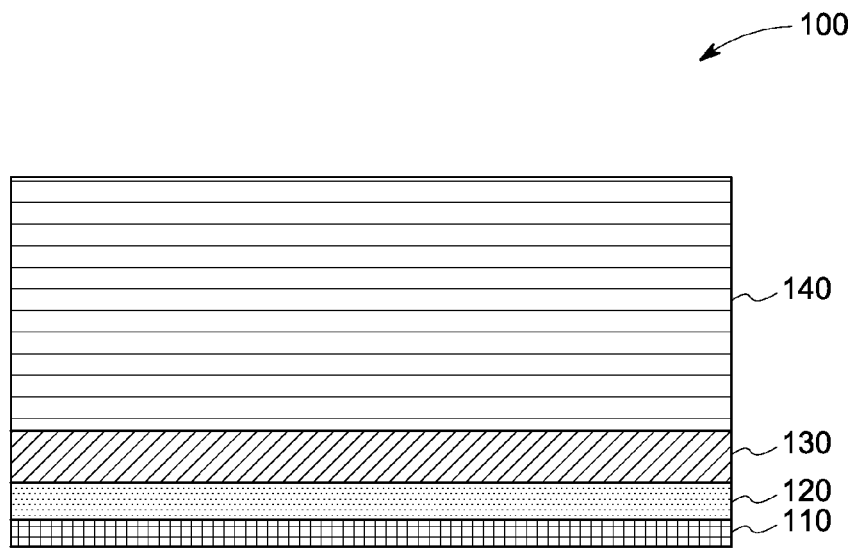
FIG. 1 is a side cross-section view of a photovoltaic device sub-structure, according to one embodiment of the invention.

As discussed in detail below, some of the embodiments of the invention include methods of making a photovoltaic device including an absorber layer. As noted earlier, the methods of making photovoltaic devices typically include copper-based post-deposition steps of introducing a dopant into the absorber layer (to increase the carrier concentration), formation of an ohmic back contact on the absorber layer (to form p+-type layer at the back interface), or both. However, the addition of copper may lead to one or more of decreased stability of the photovoltaic devices, decreased open circuit voltage ($V_{OC}$), and decreased fill factor. Without being bound by any theory, it is believed that the high mobility of the copper combined with the unstable behavior of copper telluride in the ohmic back contact may lead to migration of copper towards the front contact (interface between the window layer and the absorber layer) and a loss of performance.

Embodiments of the invention described herein address the noted shortcomings of the state of the art. Some embodiments include methods of forming a photovoltaic device including the steps of forming a doped absorber layer, disposing an ohmic back contact layer, or both. Furthermore, some embodiments include photovoltaic devices that include a doped absorber layer, an ohmic back contact layer, or both. In some embodiments, the doped absorber layer includes a metal dopant and the interfacial layer includes an ohmic metal, wherein the metal dopant and the ohmic metal are substantially free of copper.

Embodiments of the present invention advantageously provide for stable photovoltaic devices. This is in contrast to methods of making photovoltaic devices using copper, wherein higher mobility of copper and decreased stability of copper telluride may result in unstable photovoltaic devices.

Further, without being bound by any theory, it is believed that doping of the absorber layer with the metal dopant may advantageously result in increase in carrier concentration of the photo-active material. An increased carrier concentration may further advantageously result in increase in $V_{OC}$ that may furthermore result in increased photovoltaic device efficiency. Without being bound by any theory, it is believed that forming an interfacial layer that includes the ohmic metal may advantageously result in decreased resistivity of the absorber layer surface and lower open circuit resistance ($R_{OC}$), which may furthermore result in increased photovoltaic device efficiency.

Approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In some instances, the approximating language may correspond to the precision of an instrument for measuring the value.

In the following specification and the claims, the singular forms "a", "an" and "the" include plural referents unless the context clearly dictates otherwise.

The terms "transparent region" and "transparent layer" as used herein, refer to a region or a layer that allows an average transmission of at least 80% of incident electromagnetic radiation having a wavelength in a range from about 300 nm to about 850 nm. As used herein, the term "disposed on" refers to layers disposed directly in contact with each other or indirectly by having intervening layers therebetween, unless otherwise specifically indicated.

Figure 8:
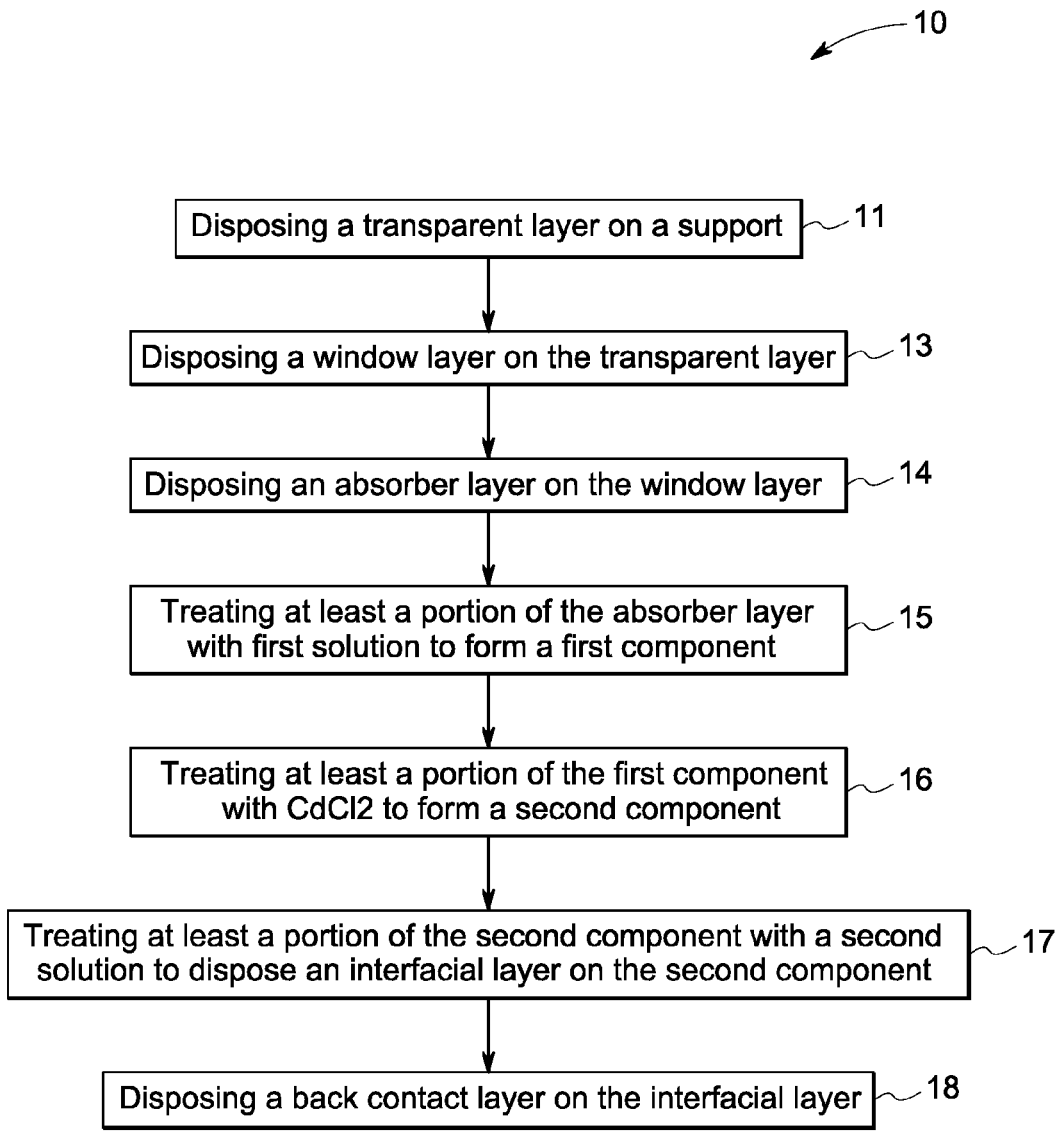
FIG. 8 is a flow chart illustration of a method of making a photovoltaic device, according to one embodiment of the invention.

As discussed in detail below, some embodiments of the invention are directed to a method of making a photovoltaic device. Referring to FIGS. 1 and 8, in one embodiment, the method 10 includes, at step 14, disposing an absorber layer 140 on a window layer 130.

The term "window layer" as used herein refers to a semiconducting layer that is substantially transparent and forms a heterojunction with the absorber layer 140. In some embodiments, the window layer 130 includes an n-type semiconductor material. In such embodiments, the absorber layer 140 may be doped to be p-type and the window layer 130 and the absorber layer 140 may form an "n-p" heterojunction. Non-limiting exemplary materials for the window layer 130 include cadmium sulfide (CdS), indium (III) sulfide ($In_2S_3$), zinc sulfide (ZnS), zinc telluride (ZnTe), zinc selenide (ZnSe), cadmium selenide (CdSe), oxygenated cadmium sulfide (CdS:O), copper oxide ($Cu_2O$), zinc oxihydrate ($ZnO.H_2O$), or combinations thereof. In a particular embodiment, the window layer 130 includes CdS.

The term "absorber layer" as used herein refers to a semiconducting layer wherein the solar radiation is absorbed. Typically, when solar radiation is incident on the photovoltaic device 100, electrons in the absorber layer 140 are excited from a lower energy "ground state," in which they are bound to specific atoms in the solid, to a higher "excited state," in which they can move through the solid.

In one embodiment, the absorber layer 140 includes a p-type semiconductor material. In one embodiment, the absorber layer 140 has an effective carrier density in a range from about $1 \times 10^{13}$ per cubic centimeter to about $1 \times 10^{16}$ per cubic centimeter. As used herein, the term "effective carrier density" refers to the average concentration of holes and electrons in a material. In such instances, the window layer 130 may be doped to be n-type, and the absorber layer 140 and the window layer 130 may form a "p-n" or "n-p" junction, as mentioned above.

In one embodiment, a photoactive material is used for forming the absorber layer 140. Suitable photo-active materials include cadmium telluride (CdTe), oxygenated cadmium telluride (CdTe:O), cadmium zinc telluride (CdZnTe), cadmium magnesium telluride (CdMgTe), cadmium manganese telluride (CdMnTe), cadmium sulfur telluride (CdSTe), zinc telluride (ZnTe), copper indium sulphide (CIS), copper indium gallium selenide (CIGS), copper zinc tin sulphide (CZTS), or combinations thereof. The above-mentioned photo-active semiconductor materials may be used alone or in combination. Further, these materials may be present in more than one layer, each layer having different type of photo-active material or having combinations of the materials in separate layers. In one particular embodiment, the absorber layer 140 includes cadmium telluride (CdTe). In one particular embodiment, the absorber layer 140 includes p-type cadmium telluride (CdTe).

In some embodiments, the window layer 130 and the absorber layer 140 may be doped with a p-type dopant or an n-type dopant to form a heterojunction. As used in this context, a heterojunction is a semiconductor junction that is composed of layers of dissimilar semiconductor material. These materials usually have non-equal band gaps. As an example, a heterojunction can be formed by contact between a layer or region of one conductivity type with a layer or region of opposite conductivity, e.g., a "p-n" junction.

In some embodiments, as indicated in FIG. 1, the window layer 130 is further disposed on a transparent layer 120 and the transparent layer 120 is disposed on a support 110. In some embodiments, the method 10 further includes, at step 11, disposing a transparent layer 120 on a support 110, as indicated in FIGS. 1 and 8. In some embodiments, the method 10 further includes, at step 13, disposing a window layer 130 on the transparent layer 120, as indicated in FIGS. 1 and 8.

Figure 2:
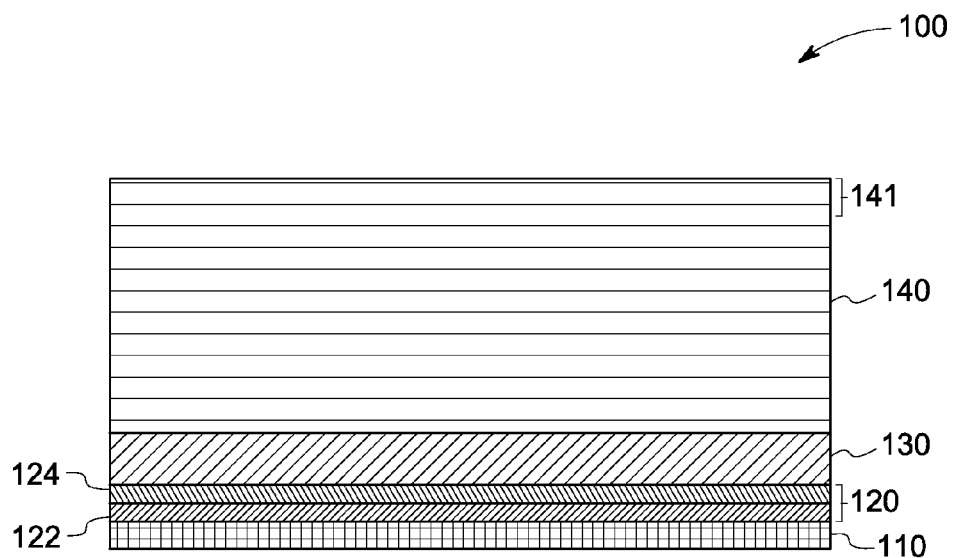
FIG. 2 is a side cross-section view of a photovoltaic device sub-structure, according to one embodiment of the invention.

In one embodiment, the transparent layer 120 includes an electrically conductive layer (sometimes referred to in the art as a front contact layer) 122 disposed on the support 110, as indicated in FIG. 2. In some embodiments, the window layer 130 is disposed directly on the electrically conductive layer 122. In an alternate embodiment, the transparent layer 120 includes an electrically conductive layer 122 disposed on the support 110 and an additional buffer layer 124 is interposed between the electrically conductive layer 122 and the window layer 130, as indicated in FIG. 2. In one embodiment, the transparent layer 120 has a thickness in a range from about 100 nanometers to about 600 nanometers.

In one embodiment, the electrically conductive layer 122 includes a transparent conductive oxide (TCO). Non-limiting examples of transparent conductive oxides include cadmium tin oxide (CTO), indium tin oxide (ITO), fluorine-doped tin oxide (SnO:F or FTO), indium-doped cadmium-oxide, cadmium stannate ($Cd_2SnO_4$ or CTO), doped zinc oxide (ZnO), such as aluminum-doped zinc-oxide (ZnO:Al or AZO), indium-zinc oxide (IZO), and zinc tin oxide ($ZnSnO_x$), or combinations thereof. Depending on the specific TCO employed and on its sheet resistance, the thickness of the electrically conductive layer 122 may be in a range of from about 50 nm to about 600 nm, in one embodiment.

In some embodiments, the photovoltaic device 100 further includes a buffer layer (optional), also called a higher resistance transparent (HRT) layer 124, interposed between the window layer 130 and the electrically conductive layer 122, as indicated in FIG. 2. In one embodiment, the thickness of the buffer layer 124 is in a range from about 50 nm to about 200 nm Non-limiting examples of suitable materials for the buffer layer 124 include tin dioxide ($SnO_2$), zinc tin oxide (ZTO), zinc-doped tin oxide ($SnO_2$:Zn), zinc oxide (ZnO), indium oxide ($In_2O_3$), or combinations thereof.

In some embodiments, as indicated in FIG. 2, the electrically conductive layer 122 and the buffer layer 124 together form a transparent layer 120. In such embodiments, the step 11 of method 10 may further include the steps of disposing an electrically conductive layer 122 on the support 110 and disposing the buffer layer 124 on the electrically conductive layer 122 to form the transparent layer 120.

Referring again to FIGS. 1, 2, and 8, in some embodiments, the step 11 includes disposing a transparent layer 120 including an electrically conductive layer 122 on a support 110, by any suitable technique, such as sputtering, chemical vapor deposition, spin coating, spray coating, or dip coating. Referring to FIGS. 2 and 8, in some embodiments, an optional buffer layer 124 may be deposited on the electrically conductive layer 122, using sputtering to form the transparent layer 120. The n-type semiconductor layer or window layer 130 may be then deposited on the transparent layer 120, at step 13, as indicated in FIGS. 1, 2 and 8. Non-limiting examples of the deposition methods for the n-type semiconductor layer 130 include one or more of close-space sublimation (CSS), vapor transport method (VTM), sputtering, and electrochemical bath deposition (CBD).

Referring again to FIGS. 1, 2, and 8, in some embodiments, as noted earlier, the method 10 further includes disposing an absorber layer 140 on the window layer 130, at step 14, by employing one or more methods selected from close-space sublimation (CSS), vapor transport method (VTM), ion-assisted physical vapor deposition (IAPVD), radio frequency or pulsed magnetron sputtering (RFS or PMS), plasma enhanced chemical vapor deposition (PECVD), and electrochemical deposition (ECD).

In some embodiments, the absorber layer 140 has a thickness in a range from about 1500 nanometers to about 5000 nanometers. In some embodiments, the absorber layer 140 has a thickness in a range from about 1500 nanometers to about 3000 nanometers. In particular embodiments, the absorber layer 140 has a thickness in a range from about 1500 nanometers to about 2000 nanometers.

As noted earlier, the methods of making photovoltaic devices may typically include post-deposition steps of introducing a dopant into the absorber layer (to increase the carrier concentration), formation of an ohmic back contact on the absorber layer, or both. Typical methods used for absorber layer doping or formation of ohmic back contact include incorporation of copper into the back end of the line processing sequence. However, the addition of copper may lead to one or more of decreased stability of the photovoltaic devices, decreased open circuit voltage $V_{OC}$, and decreased fill factor. Without being bound by any theory, it is believed that the high mobility of the copper combined with the unstable behavior of copper telluride in the ohmic back contact may lead to migration of copper towards the front contact (interface between the window layer and the absorber layer) and a loss of performance.

Figure 3:
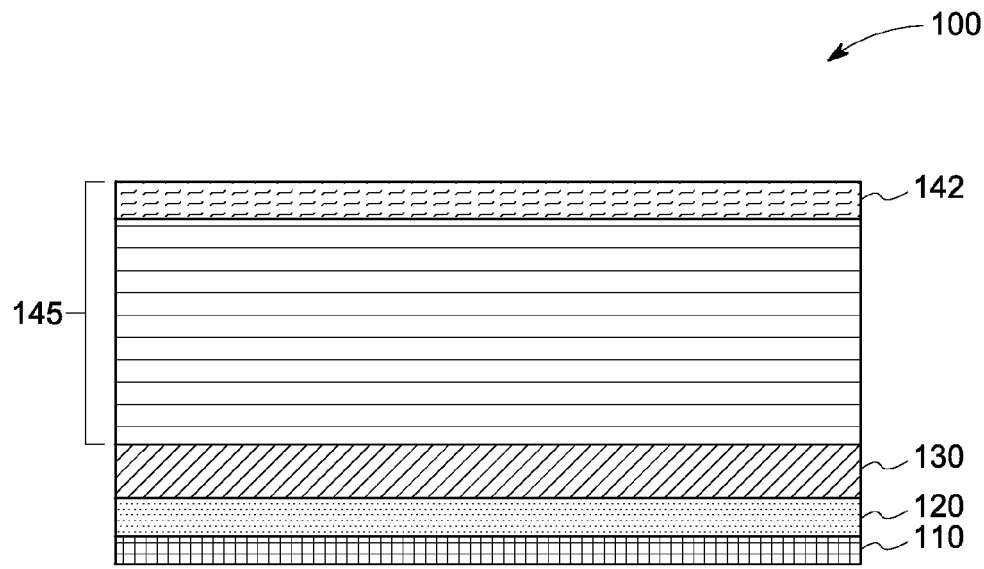
FIG. 3 is a side cross-section view of a photovoltaic device sub-structure, according to one embodiment of the invention.

Embodiments of the invention described herein address the noted shortcomings of the state of the art. In one embodiment, the method 10 further includes treating at least a portion 141 of the absorber layer 140 with a first solution, at step 15, to form a first component 145, as indicated in FIGS. 2, 3 and 8. The terms "treating", "treated", or "treatment", as used in this context means that at least a portion of the absorber layer 140 is exposed to, such as, in direct physical contact with one or more components of the first solution.

In some embodiments, the first solution includes at least one solvent and at least one first metal salt. In some embodiments, the at least one solvent includes water. In some embodiments, small amounts of water-soluble solvents may be added to provide wetting. Suitable examples of such solvents include methanol, ethanol, iso-propanol, acetone, tetrahydrofuran, diglyme, or combinations thereof. In particular embodiments, the first solution is an aqueous-based metal salt solution.

The term "metal salt" as used herein refers to a compound including at least one metal cation and at least one anion. In some embodiments, the first metal cation or the anion include at least one first metal. In some embodiments, the first metal is selected from the group consisting of manganese, cobalt, chromium, zinc, indium, tungsten, molybdenum, and combinations thereof. In some embodiments, a first metal salt may include a single first metal or a plurality of first metals. In particular embodiments, the first metal is selected from the group consisting of manganese, zinc, and combinations thereof. In some embodiments, the first solution is substantially free of copper. In some embodiments, the first metal salt is substantially free of copper. The term "substantially free" as used herein means that a concentration of copper is less than about 0.001 weight percent.

In some embodiments, the first metal salt further includes an anion selected from the group consisting of nitrate, chloride, and combinations thereof. In particular embodiments, the first metal salt further includes a chloride anion. In some embodiments, the first metal salt includes one or more of the following: manganese chloride, zinc chloride, indium chloride, cobalt chloride, chromium chloride, and combinations thereof. In some embodiments, the first metal salt includes sodium molybdate, sodium tungstate, or combinations thereof.

In some embodiments, the first metal solution includes a single first metal salt. In some other embodiments, the first metal solution includes a plurality of first metal salts. In such embodiments, the first metal solution may include a mixture of two or more first metal salts including different metals. Thus, by way of example, in some embodiments, a first solution includes a manganese salt and a zinc salt. In some embodiments, the first solution includes a combination of manganese chloride and zinc chloride.

In some embodiments, the step 15 of treating at least a portion of the absorber layer with the first solution includes a soaking treatment, such as, a portion 141 of the absorber layer is immersed in the first solution. In some embodiments, the portion 141 of the absorber layer 140, treated with the first solution, has a thickness in a range from about 1 nanometer to about 1000 nanometers. In some embodiments, the portion 141 of the absorber layer 140 has a thickness in a range from about 1 nanometer to about 500 nanometers. In some embodiments, the portion 141 of the absorber layer 140 has a thickness in a range from about 1 nanometer to about 100 nanometers.

Without being bound by any theory, it is believed that treating at least a portion 141 of the absorber layer 140 may result in cation exchange between a first metal present in the first solution and the absorber layer 140. The term "cation exchange" as used in this context refers to exchange of a portion of metal cations present in the first solution with the cations present in the absorber layer. In embodiments wherein the absorber layer includes a cadmium-based photoactive material, the treating step 15 may result in cation exchange between the cadmium cations present in the portion 141 of the absorber layer 140 and the metal cations present in the first solution.

In some embodiments, the treating step 15 may be characterized by the amount of cation exchange effected after the treatment step 15. The term "amount of cation exchange" as used in this context refers to the atomic concentration of cations in the absorber layer 140 replaced by the metal cations. Without being bound by any theory, it is believed that the amount of cation exchange may be controlled by varying one or more of the concentration of the first metal solution, treatment temperature, and time duration of treatment.

In some embodiments, treating at least a portion of the absorber layer 140 with a first solution includes contacting at least a portion of the absorber layer 140 with the first solution including the first metal salt at a concentration sufficient to effect cation exchange between a first metal present in the first solution and the absorber layer 140. In some embodiments, the first metal salt is present in the first solution at a concentration in a range from about 50 g/L to about 2000 g/L. In some embodiments, the first metal salt is present in the first solution at a concentration in a range from about 100 g/L to about 1000 g/L. In some embodiments, the first metal salt is present in the first solution at a concentration in a range from about 100 g/L to about 500 g/L.

In some embodiments, treating at least a portion of the absorber layer 140 with a first solution includes contacting at least a portion of the absorber layer 140 with the first solution at a temperature and for a time duration sufficient to effect cation exchange between a first metal present in the first solution and the absorber layer 140.

In some embodiments, step 15 includes treating at least a portion of the absorber layer 140 with the first solution at a temperature in a range from about 10° C. to about 100° C. In some embodiments, step 15 includes treating at least a portion of the absorber layer 140 with the first solution at a temperature in a range from about 20° C. to about 65° C.

In some embodiments, step 15 includes treating at least a portion of the absorber layer 140 with the first solution for a time duration in a range from about 15 seconds to about 60 minutes. In some embodiments, step 15 includes treating at least a portion of the absorber layer 140 with the first solution for a time duration in a range from about 1 minute to about 20 minutes.

As noted earlier, in some embodiments, the step 15 of treating at least a portion of the absorber layer with the first solution results in cation exchange between the first metal and the cations in the absorber layer 140. In some embodiments, the step 15 of treating at least a portion of the absorber layer with the first solution includes doping the absorber layer 140. The term "doping" as used herein refers to addition of controlled impurities or dopants to a semiconductor. In some embodiments, the first metal may function as a metal dopant in the absorber layer 140. In particular embodiments, the first metal may provide for p-type doping of the absorber layer 140.

As noted earlier, in some embodiments, a portion 141 of the absorber layer is treated with the first solution. In such embodiments, the step 15 may result in doping of the portion 141 of the absorber layer 140, at step 15 to form a doped portion 142, as indicated in FIG. 3. In some embodiments, the step 15 of treating at least a portion of the absorber layer 140 with a first solution results in formation of a first component 145, as indicated in FIG. 3. The first component 145 further includes a doped portion 142, as indicated in FIG. 3.

Figure 4:
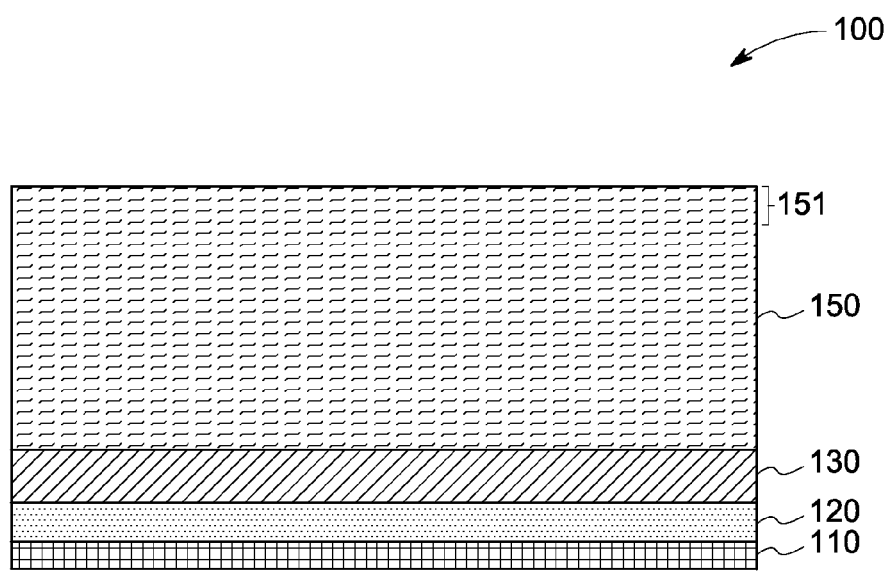
FIG. 4 is a side cross-section view of a photovoltaic device sub-structure, according to one embodiment of the invention.

In some embodiments, the method 10 further includes, at step 16, treating at least a portion of the first component 145 with cadmium chloride ($CdCl_2$) to form a second component 150, as indicated in FIGS. 3 and 4. The terms "treating", "treated", or "treatment", as used in this context means that at least a portion of the first component 145 is exposed to, such as, in direct contact with, $CdCl_2$.

In one embodiment, after the step 15 of forming a first component 145, a portion of the first component 145 may be further treated with cadmium chloride ($CdCl_2$), at step 16, as indicated in FIG. 8. In some embodiments, the step 16 may include contacting at least a portion of the first component with cadmium chloride or cadmium chloride source. In one embodiment, the first component 145 may be treated with a solution of $CdCl_2$. In another embodiment, the first component 145 may be treated with $CdCl_2$ vapor.

In some embodiments, the step 16 of treating at least a portion of the first component 145 with $CdCl_2$ furthermore includes a heating treatment. In particular embodiments, the heating treatment step may be performed subsequent to the step of contacting at least a portion of the first component 145 with $CdCl_2$.

In some embodiments, the heating treatment is performed at a temperature within a range from about 300° C. to about 500° C. In some embodiments, the heating treatment is performed at a temperature within a range from about 350° C. to about 450° C. In some embodiments, the heating treatment is performed for a time duration within a range from about 1 minute to about 60 minutes. In some embodiments, the heating treatment is performed for a time duration within a range from about 10 minutes to about 45 minutes. In some embodiments of the invention, the heating treatment is performed in an inert environment. In some other embodiments of the invention, the heating treatment is performed in an environment including an oxidizing environment. Non-limiting examples of oxidizing environments include air or oxygen.

In some embodiments, the method 10 further includes contacting at least a portion of the absorber layer 140 with an aqueous mixture of ethylene di-amine (EDA) after the step 16 of treating at least a portion of the first component with $CdCl_2$ to remove any cadmium oxide from the surface.

Without being bound by any theory, it is believed that the step 16 of treating with cadmium chloride provides for diffusion of a portion of the first metal from the doped portion 142 of the first component 145 to the bulk of the first component 145, in some embodiments. In some embodiments, the step 16 may provide for doping of the absorber layer 140 with a first metal by distributing the first metal across the thickness of the absorber layer 140. In some embodiments, the step 16 of treating with cadmium chloride results in formation of a doped absorber layer 150, as indicated in FIG. 4. In some embodiments, the terms "doped absorber layer" and "second component" are used interchangeably.

In some other embodiments, the doped absorber layer 150 includes the first metal dopant that has a variable concentration across the thickness of the doped absorber layer. In certain embodiments, a concentration of first metal at the surface of the doped absorber layer 150 is greater than the concentration of the first metal in the bulk of the doped absorber layer 150.

This is in contrast to methods of making photovoltaic devices using copper, wherein increased mobility of copper may result in migration of copper to the bulk of the absorber layer and a cadmium chloride treatment may not be required. However, as noted earlier, the increased mobility of copper may further result in unstable photovoltaic devices. In contrast, methods of the present invention advantageously provide for stable photovoltaic devices.

In some embodiments, the first metal is present in the doped absorber layer (second component) 150 at a concentration in a range from about $1\times10^{15}$ $cm^{-3}$ to about $1\times10^{19}$ $cm^{-3}$. The term "concentration" as used herein refers to the average number of atoms present per unit volume. In some embodiments, the first metal is present in the doped absorber layer (second component) 150 at a concentration in a range from about $1\times10^{16}$ $cm^{-3}$ to about $5\times10^{18}$ $cm^{-3}$. In some embodiments, the first metal is present in the doped absorber layer (second component) 150 at a concentration in a range from about $1\times10^{16}$ $cm^{-3}$ to about $1\times10^{17}$ $cm^{-3}$.

Without being bound by any theory, it is believed that doping of the absorber layer 140 with the first metal to form a doped absorber layer 150 may advantageously result in increase in carrier concentration of the photo-active material. An increased carrier concentration may further advantageously result in increase in $V_{OC}$ that may furthermore result in increased photovoltaic device efficiency.

In one embodiment, the photovoltaic device 100 has an open circuit voltage in a range greater than about 790 mV. In one embodiment, the photovoltaic device 100 has an open circuit voltage in a range greater than about 800 mV.

Figure 5:
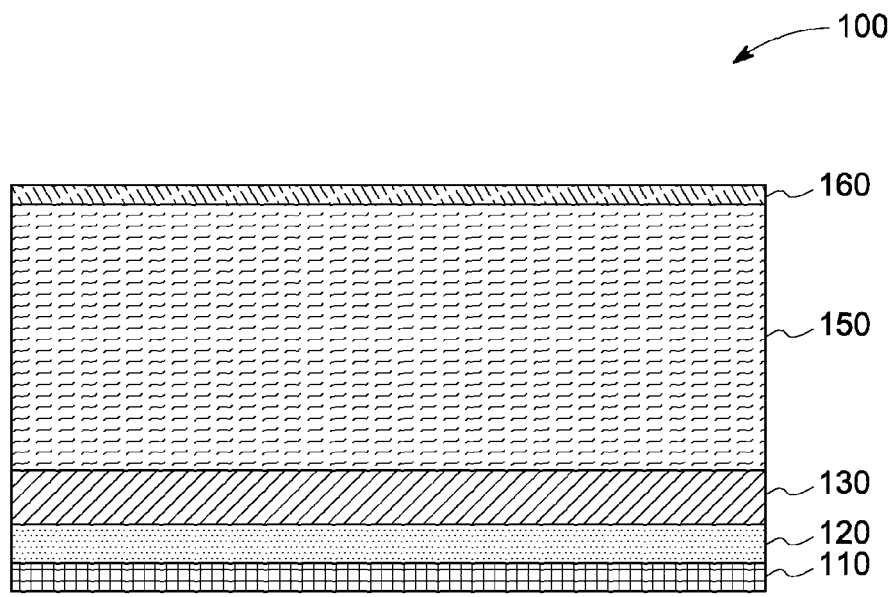
FIG. 5 is a side cross-section view of a photovoltaic device sub-structure, according to one embodiment of the invention.

As noted earlier, some embodiments of the present invention may furthermore provide for methods of disposing an ohmic back contact layer on the doped absorber layer. Particular embodiments of the present invention may furthermore provide for methods of disposing an ohmic back contact layer on the doped absorber layer, wherein the ohmic back contact layer is substantially free of copper. In one embodiment, the method 10 further includes, at step 17, treating at least a portion of the second component 150 with a second solution to dispose an interfacial layer 160 on the second component 150, as indicated in FIGS. 5 and 8. Without being bound by any theory, it is believed that the interfacial layer 160 may provide for an ohmic back contact as described later.

The terms "treating", "treated", or "treatment", as used in this context means that at least a portion of the second component (doped absorber layer) 150 is exposed to, such as, in direct contact with, one or more components of the second solution.

Figure 6:
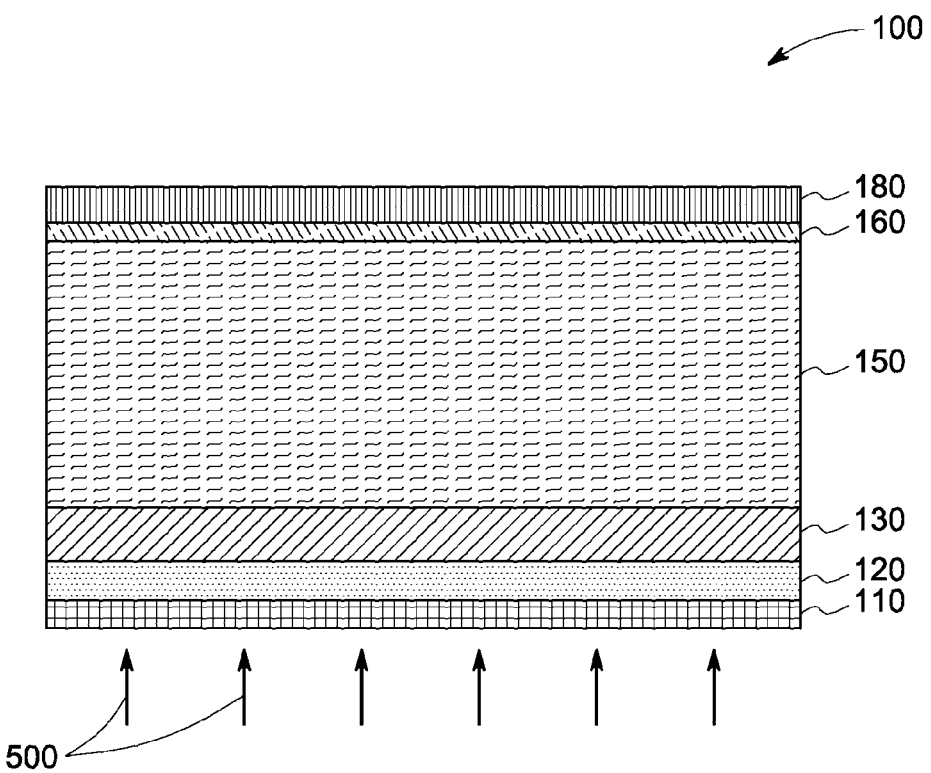
FIG. 6 is a side cross-section view of a photovoltaic device, according to one embodiment of the invention.

The term "ohmic back contact" layer as used herein refers to a semiconductor layer having an excess mobile p-type carrier or hole density compared to the p-type charge carrier or hole density in the absorber layer 140 or the doped absorber layer 150. In some embodiments, the ohmic back contact layer has a p-type carrier density in a range greater than about $1\times10^{16}$ per cubic centimeter. In some embodiments, the ohmic back contact layer has a p-type carrier density in a range from about $1\times10^{17}$ per cubic centimeter to about $1\times10^{22}$ per cubic centimeter. The interfacial layer 160 may be used as an interface between the doped absorber layer 150 and the back contact layer 180, in some embodiments, as indicated in FIG. 6. Higher carrier densities of the interfacial layer 160 may minimize the series resistance of the back contact layer 180, in comparison to other resistances within the device.

In some embodiments, the second solution includes at least one second solvent and at least one second metal salt. In some embodiments, the at least one second solvent includes water. In some embodiments, small amounts of water-soluble solvents may be added to provide wetting. Suitable examples of such solvents include methanol, ethanol, iso-propanol, acetone, tetrahydrofuran, diglyme, or combinations thereof. In particular embodiments, the second solution is an aqueous-based metal salt solution.

In some embodiments, the second metal salt includes at least one second metal. In some embodiments, the second metal is selected from the group consisting of manganese, cobalt, nickel, zinc, and combinations thereof. In some embodiments, a second metal salt may include a single metal or a plurality of metals. In particular embodiments, the second metal is selected from the group consisting of manganese, zinc, and combinations thereof. In some embodiments, the second solution is substantially free of copper. In some embodiments, the second metal salt is substantially free of copper.

In some embodiments, the second metal salt further includes an anion selected from the group consisting of nitrate, chloride, and combinations thereof. In particular embodiments, the second metal salt further includes a chloride anion. In particular embodiments, the second metal salt includes manganese chloride, zinc chloride, or combinations thereof.

In some embodiments, the second metal solution includes a single metal salt. In some other embodiments, the second metal solution includes a plurality of metal salts. In such embodiments, the second metal solution may include a mixture of two or more metal salts including different metal cations. Thus, by way of example, in some embodiments, a second solution may include a manganese salt and a zinc salt. In some embodiments, the second solution may include a combination of manganese chloride and zinc chloride.

In some embodiments, the steps 15 and 17 of method 10 further include the steps of selecting a first metal salt and a second metal salt, respectively. In some embodiments, the first metal salt and the second metal salt may be selected such that the first metal and the second metal are the same. Thus, by way of example, in some embodiments, both the first metal salt and the second metal salt may include zinc. In some other embodiments, the first metal salt and the second metal salt may be selected such that the first metal and the second metal are different. Thus, by way of example, in some embodiments, the first metal salt may include zinc and the second metal salt may include manganese, or vice versa.

In some embodiments, the step 17 of treating at least a portion of the second component 150 with the second solution includes a soaking treatment, for example, a portion of the second component 150 is immersed in the second solution.

In some embodiments, a portion 151 of the second component 150 treated with the second solution, has a thickness in a range from about 1 nanometer to about 100 nanometers. In some embodiments, the portion 151 of the second component 150 treated with the second solution, has a thickness in a range from about 1 nanometer to about 50 nanometers. In some embodiments, the portion 151 of the second component 150 treated with the second solution, has a thickness in a range from about 1 nanometer to about 10 nanometers.

Without being bound by any theory, it is believed that treating at least a portion 151 of the second component 150 may result in cation exchange between a second metal present in the second solution and the second component 150. The term "cation exchange" as used in this context refers to exchange of a portion of metal cations present in the second solution with the cations present in the surface of the second component 145. In embodiments wherein the absorber layer includes a cadmium-based photoactive material, the treating step 17 may result in cation exchange between the cadmium cations present in the portion 151 of the second component 150 and the metal cations present in the second solution.

In some embodiments, the treating step 17 may be characterized by the amount of cation exchange effected after the treatment step 17. The term "amount of cation exchange" as used in this context refers to the atomic concentration of cations in the absorber layer 140 replaced by the metal cations. Without being bound by any theory, it is believed that the amount of cation exchange may be controlled by varying one or more of the concentration of the second metal solution, treatment temperature, and time duration of treatment.

In some embodiments, treating at least a portion of the second component 150 with a second solution includes contacting at least a portion of the second component 150 with the second solution including the second metal salt at a concentration sufficient to effect cation exchange between a second metal present in the second solution and the second component 150. In some embodiments, the second metal salt is present in the second solution at a concentration in a range from about 100 g/L to about 2000 g/L. In some embodiments, the second metal salt is present in the second solution at a concentration in a range from about 100 g/L to about 1000 g/L. In some embodiments, the second metal salt is present in the second solution at a concentration in a range from about 100 g/L to about 500 g/L.

In some embodiments, treating at least a portion of the second component 150 with a second solution includes contacting at least portion of the second component 150 with the second solution at a temperature and for a time duration sufficient to effect cation exchange between a second metal present in the second solution and the second component 150.

In some embodiments, step 17 includes treating at least a portion of the second component 150 with the second solution at a temperature in a range from about 50° C. to about 80° C. In some embodiments, step 17 includes treating at least a portion of the second component 150 with the second solution at a temperature in a range from about 60° C. to about 75° C.

In some embodiments, step 17 includes treating at least a portion of the second component with the second solution for a time duration in a range from about 1 minute to about 30 minutes. In some embodiments, step 17 includes treating at least a portion of the second component with the second solution for a time duration in a range from about 2 minutes to about 10 minutes.

In some embodiments, the step 17 of treating at least a portion of the second component 150 with a second solution results in disposing an interfacial layer 160 on the second component 150, as indicated in FIG. 5. As noted earlier, without being bound by any theory, it is believed that the interfacial layer 160 may function as an ohmic back contact in some embodiments. Furthermore, in some embodiments, the interfacial layer 160 may advantageously provide for an improved stable ohmic contact in contrast to a copper-based ohmic contact.

In some embodiments, the step 17 of treating at least a portion of the second component 150 with a second solution further includes forming a telluride of the second metal in the interfacial layer 160. In such embodiments, the interfacial layer 160 includes manganese telluride, cobalt telluride, nickel telluride, zinc telluride, or combinations thereof. In particular embodiments, the interfacial layer 160 includes manganese telluride, zinc telluride, or combinations thereof. In some embodiments, the interfacial layer is substantially free of copper.

In some embodiments, the second metal is present in the interfacial layer 160 at a concentration in a range from about 0.05 atomic percent to about 5 atomic percent of the interfacial layer. The term "atomic percent" as used in this context means the percentage of atoms of the second metal present in the interfacial layer. In some embodiments, the second metal is present in the interfacial layer 160 at a concentration in a range from about 0.1 atomic percent to about 2 atomic percent of the interfacial layer. In some embodiments, the second metal is present in the interfacial layer 160 at a concentration in a range from about 0.1 atomic percent to about 1 atomic percent of the interfacial layer.

In some embodiments, the interfacial layer 160 is further enriched in tellurium and depleted in cadmium. As used in this context, the term "tellurium enriched" means that an atomic concentration of tellurium in the interfacial layer 160 is greater than an atomic concentration of tellurium in the doped absorber layer 150. In some embodiments, the atomic concentration of tellurium in the interfacial layer is greater than about 60 percent. In some embodiments, the atomic concentration of tellurium in the interfacial layer 160 is greater than about 70 percent. As used in this context, the term "cadmium depleted" means that an atomic concentration of cadmium in the interfacial layer 160 is lower than an atomic concentration of cadmium in the doped absorber layer 150. In some embodiments, the atomic concentration of cadmium in the interfacial layer 160 is less than about 10 percent. In some embodiments, the interfacial layer is enriched in elemental tellurium.

In some embodiments, the interfacial layer has a thickness in a range from about 0.5 nanometers to about 100 nanometers. In some embodiments, the interfacial layer has a thickness in a range from about 1 nanometer to about 50 nanometers. In particular embodiments, the interfacial layer has a thickness in a range from about 1 nanometer to about 10 nanometers.

Without being bound by any theory, it is believed that forming an interfacial layer 160 that includes the second metal may advantageously result in decreased resistivity of the absorber layer surface and lower open circuit resistance ($R_{OC}$), which may furthermore result in increased photovoltaic device efficiency. Furthermore, embodiments of the present invention advantageously provide for stable photovoltaic devices. This is in contrast to methods of making photovoltaic devices using copper-based ohmic back contacts, wherein decreased stability of copper telluride may result in unstable photovoltaic devices.

In one embodiment, the photovoltaic device 100 has an open circuit resistance in a range less than about 5 ohm-cm$^{-2}$. In one embodiment, the photovoltaic device 100 has an open circuit resistance in a range less than about 4 ohm-cm$^{-2}$.

Figure 7:
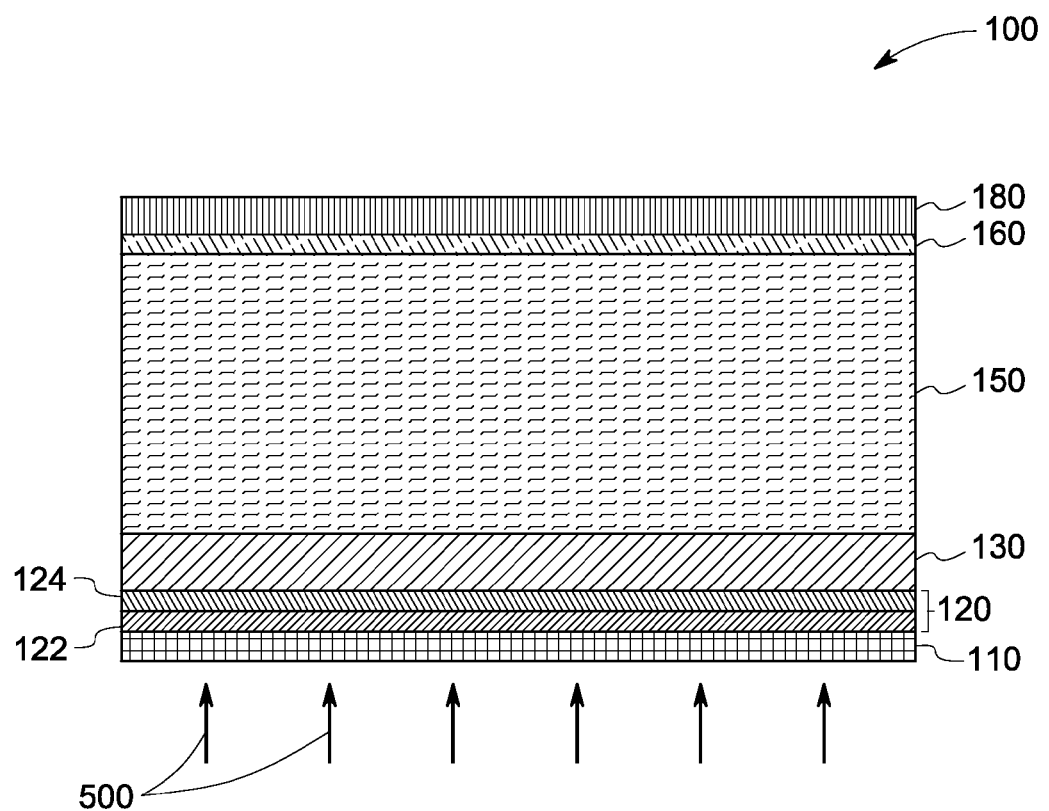
FIG. 7 is a side cross-section view of a photovoltaic device, according to one embodiment of the invention.

In one embodiment, the photovoltaic device 100 further includes a back contact layer 180, as indicated in FIGS. 6 and 7. In some embodiments, the back contact layer 180 is disposed directly on the interfacial layer 160, as indicated in FIGS. 6 and 7. In some other embodiments, the back contact layer 180 may be disposed on a second p+-type semiconductor layer 170 (optional) disposed on the interfacial layer 160 (not shown). In some embodiments, the optional p+-type semiconductor layer 170 may provide for improved diffusion properties between the back contact layer 180 and the absorber layer 160. In one embodiment, the back contact layer 180 includes gold, platinum, molybdenum, tungsten, tantalum, palladium, aluminum, chromium, nickel, or silver. In some embodiments, the back contact layer includes graphite. In certain embodiments, one or more metal layers (not shown), for example, aluminum or nickel, may be disposed on the back contact layer 180 to provide lateral conduction to the outside circuit. In one embodiment, the photovoltaic device 100 may be completed by depositing a back contact layer, at step 18, on the interfacial layer 160, as indicated in FIGS. 6 and 8.

Figure 11:
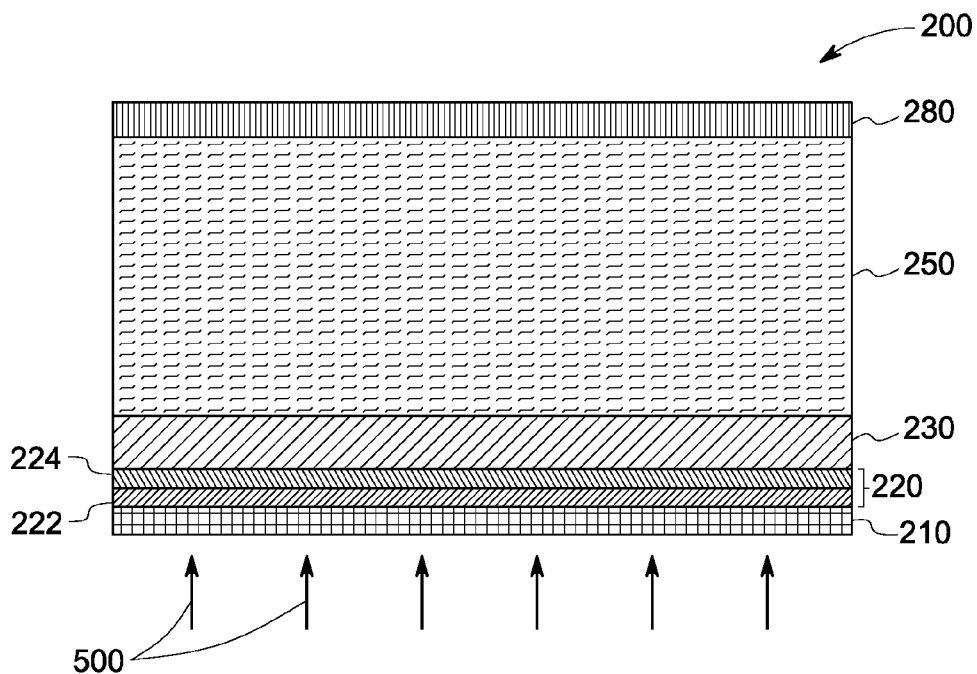
FIG. 11 is a side cross-section view of a photovoltaic device, according to one embodiment of the invention.

Some embodiments of the invention further include a photovoltaic device 100 having a doped absorber layer 150 and an interfacial layer 160, as indicated in FIG. 11. As indicated, in FIGS. 6 and 7, the doped absorber layer 150 is disposed on a window layer 130 and an interfacial layer 160 is disposed on the doped absorber layer 150.

In some embodiments, the doped absorber layer 150 includes an absorber material and a first metal. In some embodiments, the absorber material includes a suitable photo-active material, as described earlier. In particular embodiments, the absorber material includes cadmium telluride. In some embodiments, the first metal is selected from the group consisting of manganese, cobalt, chromium, zinc, indium, tungsten, molybdenum, and combinations thereof. In some embodiments, the first metal includes manganese. In some embodiments, the first metal includes zinc. In some embodiments, the first metal includes manganese and zinc. In particular embodiments, the first metal may provide for p-type doping of the absorber layer 140.

In some embodiments, a concentration of first metal in the doped absorber layer 150 is substantially constant across a thickness of the doped absorber layer 150. The term "substantially constant" as used in this context means that the variation in the concentration of first metal is less than about 10 percent across the thickness of the doped absorber layer 150. In some other embodiments, a concentration of first metal in the doped absorber layer 150 is compositionally graded across a thickness of the doped absorber layer 150. The term "compositionally graded" as used in this context means that a concentration of first metal continuously changes across a thickness of the doped absorber layer 150.

In some embodiments, as indicated in FIGS. 6 and 7, the window layer 130 is further disposed on a transparent layer 120 and the transparent layer 120 is disposed on a support 110. In one embodiment, the transparent layer 120 includes an electrically conductive layer (sometimes referred to in the art as a front contact layer) 122 disposed on the support 110, as indicated in FIG. 7. In some embodiments, the window layer 130 is disposed directly on the electrically conductive layer 122. In an alternate embodiment, the transparent layer 120 includes an electrically conductive layer 122 disposed on the support 110 and an additional buffer layer 124 is interposed between the electrically conductive layer 122 and the window layer 130, as indicated in FIG. 7. The support 110, the transparent layer 120, the electrically conductive layer 122, the buffer layer 124, the window layer 130, and the doped absorber layer 150 may include materials and configurations as described herein earlier.

In one embodiment, the photovoltaic device 100 further includes a back contact layer 180, as indicated in FIGS. 6 and 7. In some embodiments, the back contact layer 180 is disposed directly on the interfacial layer 160, as indicated in FIGS. 6 and 7. In some other embodiments, the back contact layer 180 may be disposed on an additional p+-type semiconductor layer (not shown) disposed on the interfacial layer 160. In certain embodiments, another metal layer (not shown), for example, aluminum, may be disposed on the back contact layer 180 to provide lateral conduction to the outside circuit.

Some embodiments of the invention further include a photovoltaic module, including one or more photovoltaic devices 100 as described earlier.

Figure 9:
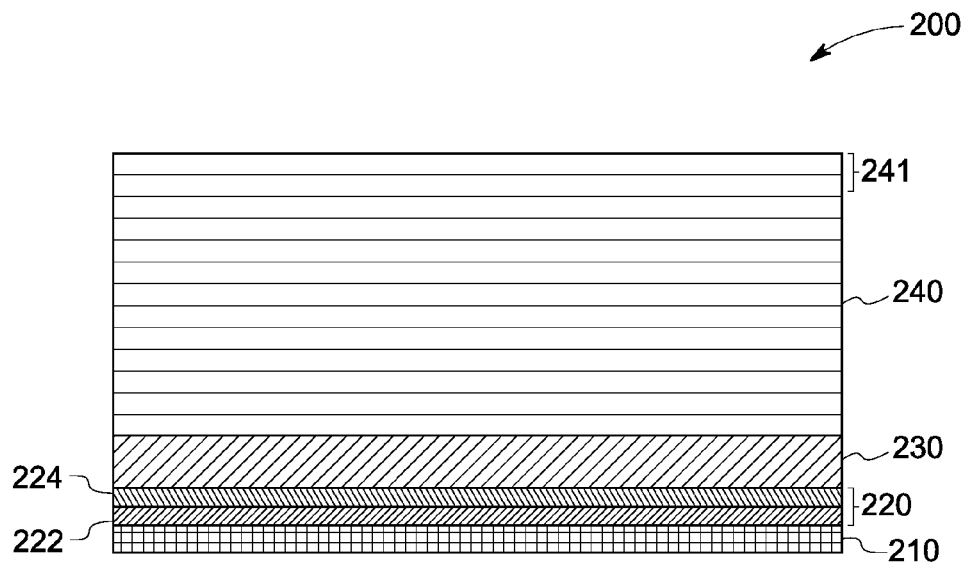
FIG. 9 is a side cross-section view of a photovoltaic device sub-structure, according to one embodiment of the invention.
Figure 12:
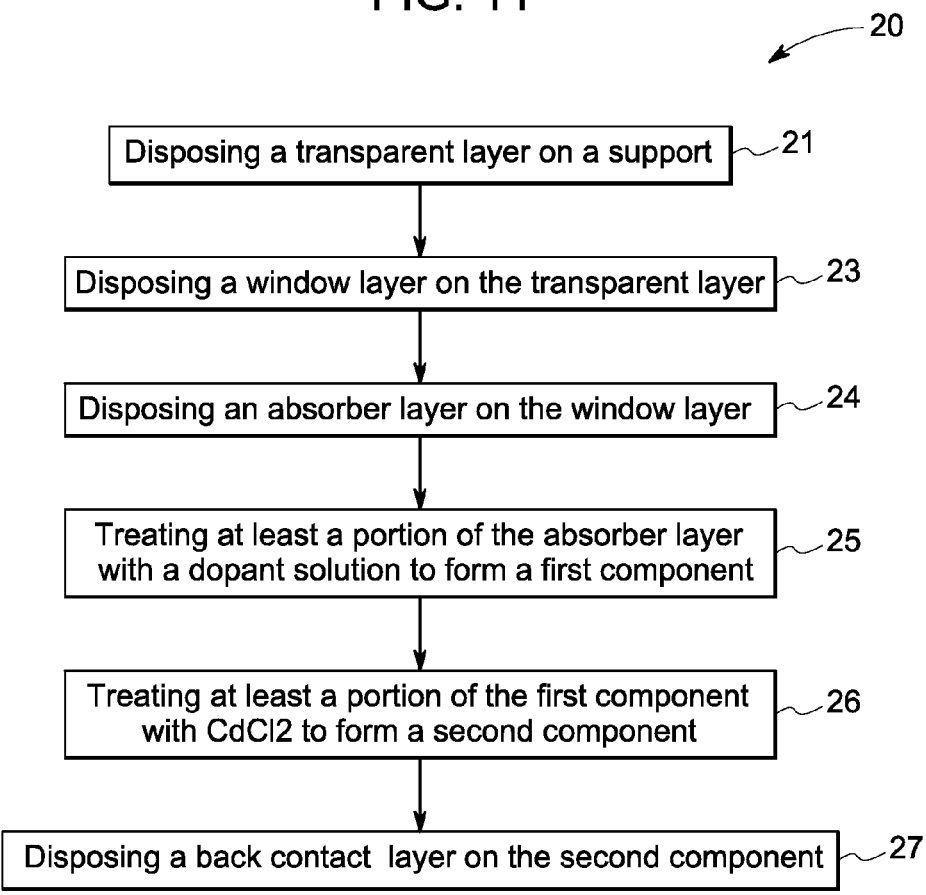
FIG. 12 is a flow chart illustration of a method of making a photovoltaic device, according to one embodiment of the invention.

The foregoing discussion is in the context of embodiments including methods of forming a doped absorber layer and further disposing an ohmic back contact layer on the doped absorber layer by employing a two-step cation-exchange approach. Furthermore, the foregoing discussion is in the context of embodiments including photovoltaic devices that include both a doped absorber layer and an ohmic back contact layer disposed on the doped absorber layer Some other embodiments of the present invention include methods for forming a doped absorber layer and photovoltaic devices including the doped absorber layer. Referring now to FIGS. 9 and 12, in one embodiment, a method 20 of making a photovoltaic device 200 includes, at step 24, disposing an absorber layer 240 on a window layer 230 using a suitable technique as described earlier. In some embodiments, the method 20 further includes, at step 21, disposing a transparent layer 220 on a support 210 using a suitable technique as described earlier, as indicated in FIGS. 9 and 12. In some embodiments, the method 20 further includes, at step 23, disposing a window layer 230 on the transparent layer 220 using a suitable technique as described earlier, as indicated in FIGS. 9 and 12.

Figure 10:
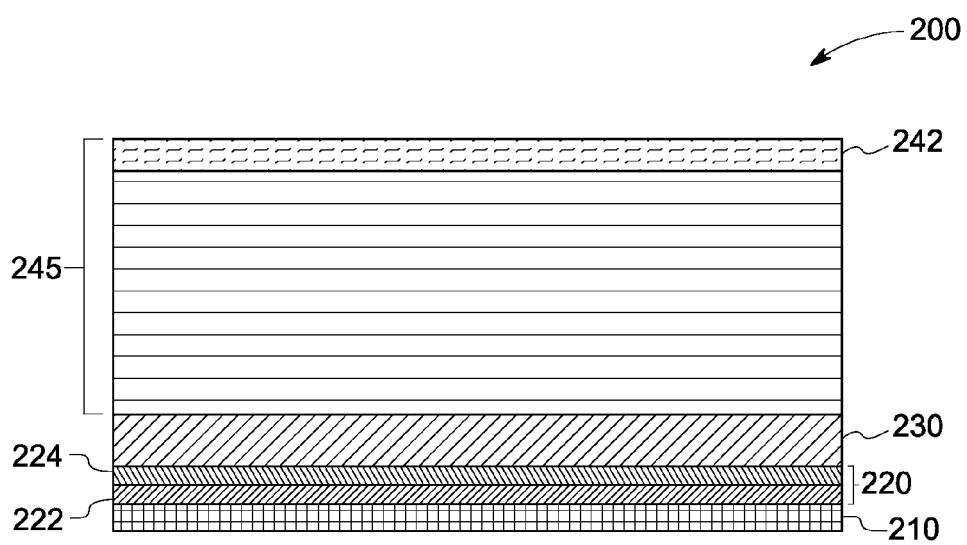
FIG. 10 is a side cross-section view of a photovoltaic device sub-structure, according to one embodiment of the invention.

In one embodiment, the method 20 further includes treating at least a portion of the absorber layer 240 with a dopant solution, at step 25, to form a first component 245, as indicated in FIGS. 9, 10 and 12. The term "dopant solution", as used herein, refers to a metal solution that includes a metal suitable as a dopant in the absorber layer. It should be noted, that in some embodiments, the dopant solution and the first solution (described earlier) are the same. The terms "treating", "treated", or "treatment", as used in this context means that at least a portion of the absorber layer 240 is exposed to, such as, in direct physical contact with one or more components of the dopant solution.

In some embodiments, the dopant solution includes at least one solvent and at least one dopant metal salt. In some embodiments, the at least one solvent includes water. In some embodiments, small amounts of water-soluble solvents may be added to provide wetting. Suitable examples of such solvents include methanol, ethanol, iso-propanol, acetone, tetrahydrofuran, diglyme, or combinations thereof. In particular embodiments, the dopant solution is an aqueous-based metal salt solution.

In some embodiments, the dopant metal salt includes a metal dopant. In some embodiments, the metal dopant is selected from the group consisting of manganese, cobalt, chromium, zinc, indium, tungsten, molybdenum, and combinations thereof. In particular embodiments, the metal dopant is selected from the group consisting of manganese, zinc, and combinations thereof. In some embodiments, the dopant solution is substantially free of copper. In some embodiments, the dopant metal salt is substantially free of copper.

In some embodiments, the dopant metal salt further includes an anion selected from the group consisting of nitrate, chloride, and combinations thereof. In particular embodiments, the dopant metal salt further includes a chloride anion. In particular embodiments, the dopant metal salt includes manganese chloride, zinc chloride, and combinations thereof.

In some embodiments, the step 25 of treating at least a portion of the absorber layer 240 with the dopant metal solution includes a soaking treatment. In particular embodiments, the step 25 of treating at least a portion of the absorber layer 240 with the dopant metal solution include a soaking treatment, such as, a portion 241 of the absorber layer 240 is soaked in the dopant solution.

Without being bound by any theory, it is believed that treating at least a portion of the absorber layer 240 may result in cation exchange between a metal dopant present in the metal dopant solution and the absorber layer 240. In some embodiments, the step 25 of treating at least a portion of the absorber layer 240 with the first solution includes doping the absorber layer 240. The term "doping" as used herein refers to addition of controlled impurities or dopants to a semiconductor. In particular embodiments, the metal dopant may provide for p-type doping of the absorber layer 240.

In some embodiments, the method 20 further includes, at step 26, treating at least a portion of the first component 245 with cadmium chloride ($CdCl_2$) to form a second component 250, as indicated in FIGS. 11 and 12. The terms "treating", "treated", or "treatment", as used in this context means that at least a portion of the first component 245 is exposed to, such as, in direct contact with $CdCl_2$. In some embodiments, the step 26 may include contacting at least a portion of the first component 245 with cadmium chloride or cadmium chloride source. In one embodiment, the first component 245 may be treated with a solution of $CdCl_2$. In another embodiment, the first component 245 may be treated with $CdCl_2$ vapor.

Furthermore, the step 26 of treating at least a portion of the first component 245 with $CdCl_2$ includes a heating treatment. In particular embodiments, the heating treatment step is performed subsequent to the step of contacting at least a portion of the first component 245 with $CdCl_2$.

Without being bound by any theory, it is believed that the step 26 of treating with cadmium chloride provides for diffusion of the metal dopant from the doped portion 242 of the first component 245 to the bulk of the first component 245. In some embodiments, the step 26 may provide for doping of the absorber layer 240 with a first metal by distributing the metal dopant across the thickness of the absorber layer 240. In some embodiments, the step 26 of treating with cadmium chloride results in formation of a doped absorber layer 250, as indicated in FIG. 11. In such embodiments, the terms "doped absorber layer" and "second component" may be used interchangeably.

In some other embodiments, the doped absorber layer 250 includes the metal dopant that has a variable concentration across the thickness of the doped absorber layer 250. In certain embodiments, a concentration of metal dopant at the surface of the doped absorber layer 250 is greater than the concentration of the metal dopant in the bulk of the doped absorber layer 250.

Without being bound by any theory, it is believed that doping of absorber layer 240 with the metal dopant to form a doped absorber layer 250 may advantageously result in increase in carrier concentration of the photo-active material. An increased carrier concentration may further advantageously result in increase in Voc that may furthermore result in increased photovoltaic device efficiency.

In some embodiments, the method 20 further includes contacting at least a portion of the absorber layer 240 with a an aqueous mixture of ethylene diamine (EDA) after the step 26 of treating at least a portion of the doped absorber layer 240 with the $CdCl_2$.

In one embodiment, the photovoltaic device 200 may be completed by depositing a back contact layer 280 on the second component 250, as indicated in FIGS. 11 and 12. In one embodiment, the photovoltaic device 200 has an open circuit voltage in a range greater than about 790 mV. In one embodiment, the photovoltaic device 200 has an open circuit voltage in a range greater than about 800 mV.

Some embodiments of the invention further include a photovoltaic device 200 having a doped absorber layer 250, as indicated in FIG. 11. In some embodiments, the doped absorber layer 250 includes an absorber material and a metal dopant. As noted earlier, the absorber material includes a suitable photo-active material, as described earlier. In particular embodiments, the absorber material includes cadmium telluride.

In some embodiments, the metal dopant is selected from the group consisting of manganese, cobalt, chromium, zinc, indium, tungsten, molybdenum, and combinations thereof. In some embodiments, the metal dopant includes manganese. In some embodiments, the metal dopant includes zinc. In some embodiments, the metal dopant includes manganese and zinc. In particular embodiments, the metal dopant may provide for p-type doping of the absorber layer 240.

In some embodiments, a concentration of metal dopant in the doped absorber layer 250 is substantially constant across a thickness of the doped absorber layer 250. The term "substantially constant" as used in this context means that the variation in the concentration of metal dopant is less than about 10 percent across the thickness of the doped absorber layer 250. In some other embodiments, a concentration of metal dopant in the doped absorber layer 250 is compositionally graded across a thickness of the doped absorber layer 250. The term "compositionally graded" as used in this context means that a concentration of metal dopant continuously changes across a thickness of the doped absorber layer 250.

In some embodiments, as indicated in FIG. 11, the window layer 230 is further disposed on a transparent layer 220 and the transparent layer 220 is disposed on a support 210. In one embodiment, the transparent layer 220 includes an electrically conductive layer (sometimes referred to in the art as a front contact layer) 222 disposed on the support 210, as indicated in FIG. 11. In some embodiments, the window layer 230 is disposed directly on the electrically conductive layer 222. In an alternate embodiment, the transparent layer 220 includes an electrically conductive layer 222 disposed on the support 210 and an additional buffer layer 224 is interposed between the electrically conductive layer 222 and the window layer 230, as indicated in FIG. 11. The support 210, the transparent layer 220, the window layer 230 and the doped absorber layer 250 may include materials and configurations as described herein earlier.

In one embodiment, the photovoltaic device 200 further includes a back contact layer 280, as indicated in FIG. 11. In some embodiments, the back contact layer 280 is disposed directly on the doped absorber layer 250, as indicated in FIG. 11. In some other embodiments, the back contact layer 280 may be disposed on a p+-type semiconductor layer (not shown) disposed on the doped absorber layer 250. In certain embodiments, another metal layer (not shown), for example, aluminum, may be disposed on the back contact layer 280 to provide lateral conduction to the outside circuit.

Some embodiments of the invention further include a photovoltaic module, including one or more photovoltaic devices 200 as described earlier.

Figure 13:
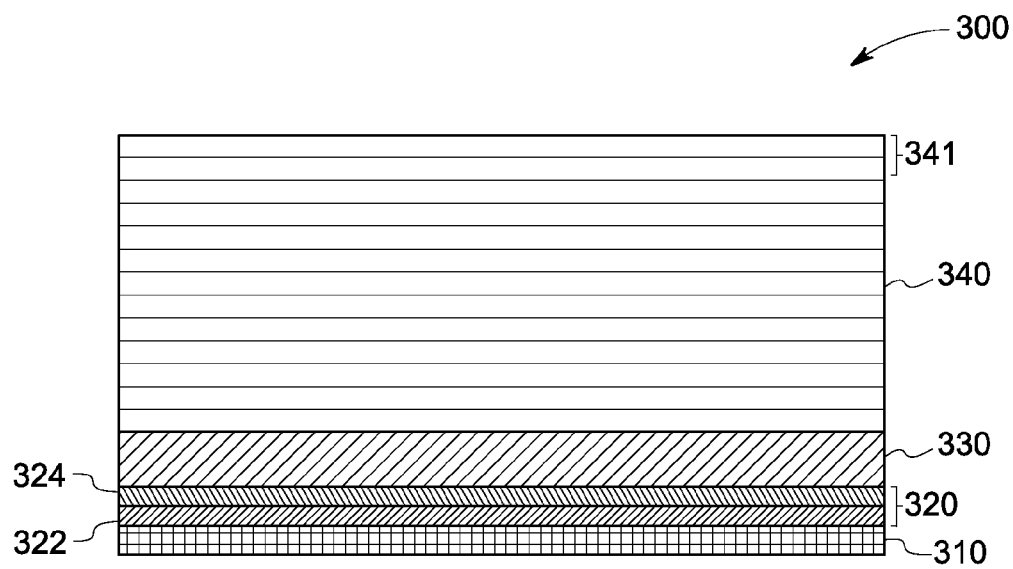
FIG. 13 is a side cross-section view of a photovoltaic device sub-structure, according to one embodiment of the invention.
Figure 15:
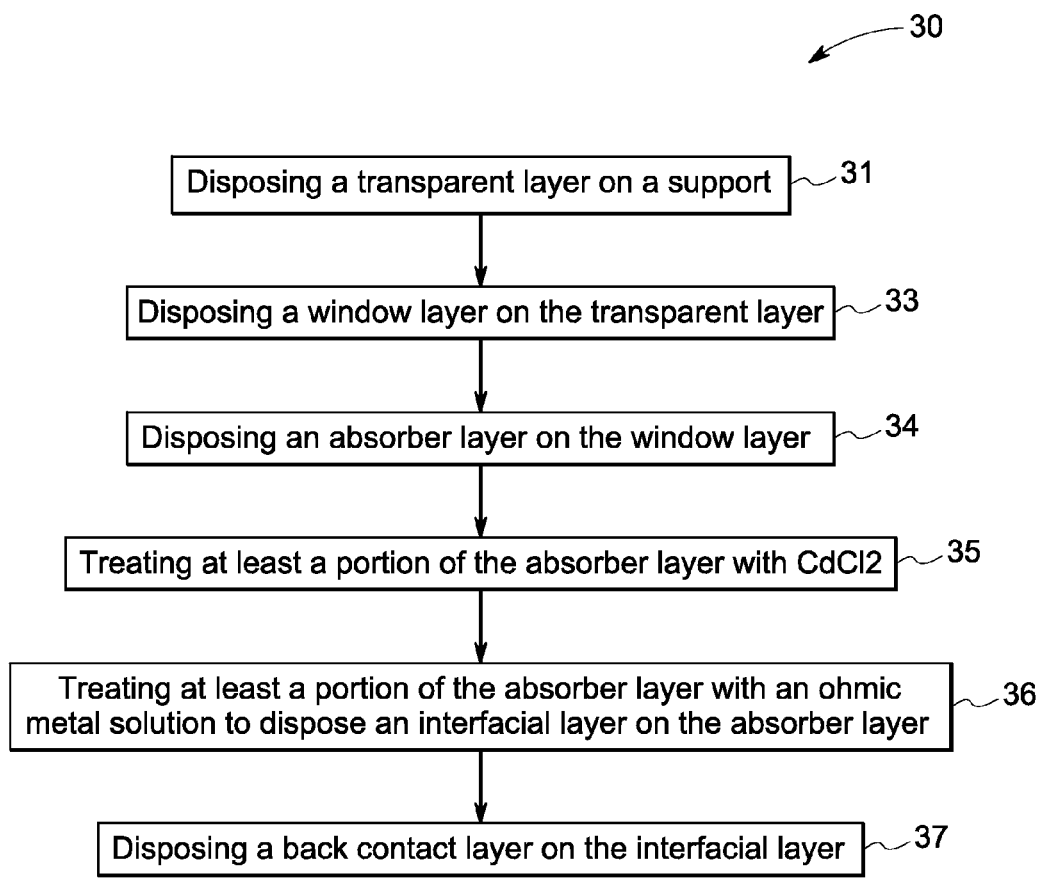
FIG. 15 is a flow chart illustration of a method of making a photovoltaic device, according to one embodiment of the invention.

Some embodiments of the present invention include methods for disposing an interfacial layer on the absorber layer and photovoltaic devices including the interfacial layer. Referring now to FIGS. 13 and 15, in one embodiment, a method 30 of making a photovoltaic device 300 includes, at step 34, disposing an absorber layer 340 on a window layer 330 using a suitable technique as described earlier. In some embodiments, the method 30 further includes, at step 33, disposing a window layer 330 on the transparent layer 320 before disposing the absorber layer 340 on the window layer 320 using a suitable technique as described earlier, as indicated in FIGS. 13 and 15. In some embodiments, the method 320 further includes, at step 31, disposing a transparent layer 320 on a support 310 before disposing the window layer 330 on the transparent layer 320 using a suitable technique as described earlier, as indicated in FIGS. 13 and 15.

In some embodiments, the method 30 further includes, at step 35, treating at least a portion of the absorber layer 340 with cadmium chloride and heating the absorber layer 340 before disposing the interfacial layer 360, as indicated in FIG. 13. The cadmium chloride treatment step and the subsequent heating step are as described earlier. In some embodiments, the method 30 further includes contacting at least a portion of the absorber layer 340 with an aqueous mixture of ethylene di-amine (EDA) after the step 35 of treating at least a portion of the absorber layer 340 with the $CdCl_2$ solution.

Figure 14:
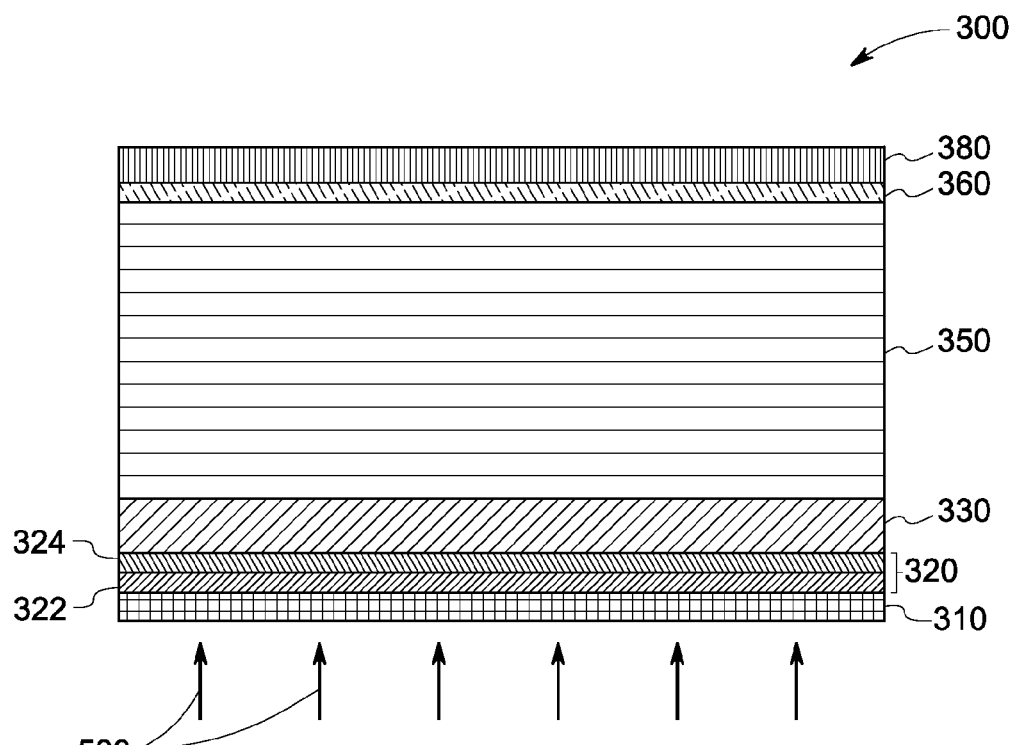
FIG. 14 is a side cross-section view of a photovoltaic device, according to one embodiment of the invention.

As noted earlier, some embodiments of the present invention furthermore provide for methods of disposing an ohmic back contact layer on the absorber layer. In one embodiment, the method 30 further includes, at step 36, treating at least a portion of the absorber layer 340 with an ohmic metal solution to dispose an interfacial layer 360 on the absorber layer 340, as indicated in FIGS. 14 and 15. Without being bound by any theory, it is believed that the interfacial layer 360 may provide for an ohmic back contact.

The term "ohmic metal solution", as used herein, refers to a metal solution that includes a metal suitable to form the interfacial layer 360. It should be noted, that in some embodiments, the ohmic metal solution and the second solution (described earlier) are the same. The terms "treating", "treated", or "treatment", as used in this context means that at least a portion of the absorber layer 340 is exposed to, such as, in direct contact with one or more components of the ohmic metal solution.

In some embodiments, the ohmic metal solution includes at least one solvent and at least one ohmic metal salt. In some embodiments, the ohmic metal salt includes at least one ohmic metal cation. In some embodiments, the ohmic metal is selected from the group consisting of manganese, cobalt, nickel, zinc, and combinations thereof.

In some embodiments, the ohmic metal salt further includes an anion selected from the group consisting of nitrate, chloride, and combinations thereof. In particular embodiments, the ohmic metal salt further includes a chloride anion. In particular embodiments, the ohmic metal salt includes manganese chloride, zinc chloride, or combinations thereof.

In some embodiments, the step 36 of treating at least a portion of the absorber layer 340 with the ohmic metal solution includes a soaking treatment. In particular embodiments, the step 36 of treating at least a portion of the absorber layer 340 with the ohmic metal solution include a soaking treatment, such as, a portion of the absorber layer 340 is immersed in the ohmic metal solution.

In some embodiments, the step 36 of treating at least a portion of the absorber layer 340 with an ohmic metal solution further includes forming a telluride of the ohmic metal in the interfacial layer 360. In such embodiments, the interfacial layer 360 includes manganese telluride, cobalt telluride, nickel telluride, zinc telluride, or combinations thereof. In particular embodiments, the interfacial layer 360 includes manganese telluride, zinc telluride, or combinations thereof. In some embodiments, the interfacial layer is substantially free of copper.

In some embodiments, the ohmic metal is present in the interfacial layer 360 at a concentration in a range from about 0.05 atomic percent to about 5 atomic percent of the interfacial layer. The term "atomic percent" as used herein means the average concentration of atoms of the ohmic metal present in the interfacial layer. In some embodiments, the ohmic metal is present in the interfacial layer 360 at a concentration in a range from about 0.1 atomic percent to about 1 atomic percent of the interfacial layer.

In some embodiments, the interfacial layer 360 is further enriched in tellurium and depleted in cadmium. As used in this context, the term "tellurium enriched" means that an atomic concentration of tellurium in the interfacial layer 360 is greater than an atomic concentration of tellurium in the absorber layer 340. In some embodiments, the atomic concentration of tellurium in the interfacial layer 360 is greater than about 60 percent. In some embodiments, the atomic concentration of tellurium in the interfacial layer 360 is greater than about 70 percent. As used in this context, the term "cadmium depleted" means that an atomic concentration of cadmium in the interfacial layer 360 is lower than an atomic concentration of cadmium in the absorber layer 340. In some embodiments, the atomic concentration of cadmium in the interfacial layer 360 is less than about 10 percent. In some embodiments, the interfacial layer 360 is enriched in elemental tellurium.

Without being bound by any theory, it is believed that forming an interfacial layer 360 that includes the ohmic metal may advantageously result in decreased resistivity of the absorber layer surface and lower open circuit resistance ($R_{OC}$), which may furthermore result in increased photovoltaic device efficiency. In one embodiment, the photovoltaic device 300 has an open circuit resistance in a range less than about 5 ohm-cm$^{-2}$. In one embodiment, the photovoltaic device 300 has an open circuit resistance in a range less than about 4 ohm-cm$^{-2}$.

In one embodiment, the photovoltaic device 300 may be completed by depositing, at step 37, a back contact layer 380 on the interfacial layer 360, as indicated in FIG. 14.

Some embodiments of the invention further include a photovoltaic device 300 including an interfacial layer 360, as indicated in FIG. 14. In some embodiments, the photovoltaic device 300 includes an absorber layer 340 disposed on a window layer 330. In some embodiments, as indicated in FIG. 14, the photovoltaic device 300 further includes an interfacial layer 360 disposed on the absorber layer 340. As noted earlier, without being bound by any theory, it is believed that the interfacial layer 360 provides an ohmic back contact in the photovoltaic device 300.

In some embodiments, the interfacial layer 360 includes an ohmic metal. In some embodiments, the ohmic metal is selected from the group consisting of manganese, cobalt, nickel, zinc, and combinations thereof. In some embodiments, the ohmic metal includes manganese. In some embodiments, the ohmic metal includes zinc.

In some embodiments, a concentration of ohmic metal in the interfacial layer 360 is substantially constant across a thickness of the interfacial layer 360. The term "substantially constant" as used in this context means that the variation in the concentration of ohmic metal is less than about 10 percent across the thickness of the interfacial layer 360. In some other embodiments, a concentration of ohmic metal in the interfacial layer 360 is compositionally graded across a thickness of the interfacial layer 360. The term "compositionally graded" as used in this context means that a concentration of ohmic metal continuously changes across a thickness of the interfacial layer 360.

In some embodiments, the interfacial layer 360 further includes an absorber material. As noted earlier, the absorber material includes a suitable photo-active material, as described earlier. In particular embodiments, the absorber material includes cadmium telluride.

In some embodiments, as indicated in FIG. 14, the window layer 330 is further disposed on a transparent layer 320 and the transparent layer 320 is disposed on a support 310. In one embodiment, the transparent layer 320 includes an electrically conductive layer (sometimes referred to in the art as a front contact layer) 322 disposed on the support 310, as indicated in FIG. 14. In some embodiments, the window layer 330 is disposed directly on the electrically conductive layer 322. In an alternate embodiment, the transparent layer 320 includes an electrically conductive layer 322 disposed on the support 310 and an additional buffer layer 324 is interposed between the electrically conductive layer 322 and the window layer 330, as indicated in FIG. 14. The support 310, the transparent layer 320, the electrically conductive layer 322, the buffer layer 324, the window layer 330 and the absorber layer 340 may include materials and configurations as described herein earlier.

In one embodiment, the photovoltaic device 300 further includes a back contact layer 380, as indicated in FIG. 14. In some embodiments, the metal layer 380 is disposed directly on the absorber layer 340, as indicated in FIG. 14. In some other embodiments, the back contact layer 380 may be disposed on a p+-type semiconductor layer (not shown) disposed on the absorber layer 340. In certain embodiments, another metal layer (not shown), for example, aluminum, may be disposed on the metal layer 380 to provide lateral conduction to the outside circuit.

Some embodiments of the invention further include a photovoltaic module, including one or more photovoltaic devices 300, as described earlier.

EXAMPLES

Example 1

Preparation of CdTe/CdS/ZnO/FTO/Glass Sample

A multi-layered sample including CdTe was prepared by depositing fluorine tin oxide (FTO) on a glass support followed by deposition of zinc tin oxide (ZTO) layer on the FTO. Cadmium sulfide (CdS) was then deposited on the ZTO layer followed by deposition of cadmium telluride (CdTe) on the CdS layer to form CdTe/CdS/ZnO/FTO/glass sample.

Example 2

Treatment of CdTe with Manganese Chloride ($MnCl_2$) Followed by a Cadmium Chloride ($CdCl_2$) Bake The CdTe/CdS/ZTO/FTO/glass sample of Example 1 was immersed in a solution of manganese chloride ($MnCl_2.4H_2O$) (500 g/L) at 22° C. for 10 minutes. The sample was then rinsed for 2 minutes with de-ionized water and dried. The dried sample was coated with $CdCl_2$ (0.1 mg/cm$^2$) and heat treated at 400° C. for 40 minutes. The $CdCl_2$ treated sample was rinsed for 2 minutes with de-ionized water followed by immersion in ethylene diamine (50% in water) at 22° C. for 1 minute. The resulting sample was then rinsed for 2 minutes with de-ionized water and dried. The device (Sample 1) was completed by depositing colloidal graphite (AquaDAG) paste on the sample and drying.

Table 3 provides the details of the different metal salt treatment conditions and the surface photo voltage (SPV) values measured for samples treated with manganese chloride ($MnCl_2$).

TABLE 1

Treatment conditions for $MnCl_2$ treatment and surface voltage values

| Concentration (g/L) | Temperature (° C.) | Time | SPV (milli Volts) |
|---|---|---|---|
| 100 | 25 | 10 | 816 |
| 100 | 25 | 15 | 820 |
| 100 | 65 | 10 | 810 |
| 100 | 65 | 10 | 811 |
| 100 | 65 | 10 | 811 |
| 100 | 65 | 10 | 811 |
| 100 | 65 | 10 | 812 |
| 100 | 65 | 10 | 816 |
| 100 | 65 | 30 | 810 |
| 500 | 25 | 1 | 816 |
| 500 | 25 | 2 | 811 |
| 500 | 25 | 2 | 812 |

TABLE 1-continued

Treatment conditions for $MnCl_2$ treatment and surface voltage values

| Concentration (g/L) | Temperature (° C.) | Time | SPV (milli Volts) |
|---|---|---|---|
| 500 | 25 | 2 | 816 |
| 500 | 25 | 10 | 810 |

Comparative Example 1

Treatment of CdTe with a $CdCl_2$ Bake

The CdTe/CdS/ZnO/FTO/glass sample of Example 1 was coated with $CdCl_2$ (0.1 mg/cm$^2$) and heat treated at 400° C. for 40 minutes. The $CdCl_2$ treated sample was rinsed for 2 minutes with de-ionized water followed by immersion in ethylene diamine (50% in water) at 22° C. for 1 minute. The resulting sample was then rinsed for 2 minutes with de-ionized water and dried. The device (Comparative Sample 1) was completed by depositing colloidal graphite (AquaDAG) paste on the sample and drying.

Comparative Example 2

Treatment of CdTe with a Copper Salt Followed by a $CdCl_2$ Bake

The CdTe/CdS/ZTO/FTO/glass sample of Example 1 was immersed in a solution of copper nitrate, $Cu(NO_3)_2 \cdot 2.5\ H_2O$ (5 g/L) at 22° C. for 1 minute. The sample was then rinsed for 2 minutes with de-ionized water and dried. The dried sample was coated with $CdCl_2$ (0.1 mg/cm$^2$) and heat treated at 400° C. for 40 minutes. The $CdCl_2$ treated sample was rinsed for 2 minutes with de-ionized water followed by immersion in ethylene diamine (50% in water) at 22° C. for 1 minute. The resulting sample was then rinsed for 2 minutes with de-ionized water and dried. The device (Comparative Sample 2) was completed by depositing colloidal graphite (AquaDAG) paste on the sample and drying.

Comparative Example 3

Treatment of CdTe with a Copper Salt Followed by a $CdCl_2$ Bake

The CdTe/CdS/ZTO/FTO/glass sample of Example 1 was immersed in an aqueous solution of copper chloride, CuCl in 15% HCl (5 g/L) at 22° C. for 1 minute. The sample was then rinsed for 2 minutes with de-ionized water and dried. The dried sample was coated with $CdCl_2$ (0.1 mg/cm$^2$) and heat treated at 400° C. for 40 minutes. The $CdCl_2$ treated sample was rinsed for 2 minutes with de-ionized water followed by immersion in ethylene diamine (50% in water) at 22° C. for 1 minute. The resulting sample was then rinsed for 2 minutes with de-ionized water and dried. The device (Comparative Sample 3) was completed by depositing colloidal graphite (AquaDAG) paste on the sample and drying.

Comparative Example 4

Treatment of CdTe with a Copper Salt Followed by a $CdCl_2$ Bake

The CdTe/CdS/ZTO/FTO/glass sample of Example 1 was immersed in an aqueous solution of copper chloride, $CuCl_2 \cdot 2H_2O$ (1 mg/L) at 22° C. for 1 minute. The sample was then rinsed for 2 minutes with de-ionized water and dried. The dried sample was coated with $CdCl_2$ (0.1 mg/cm$^2$) and heat treated at 400° C. for 40 minutes. The $CdCl_2$ treated sample was rinsed for 2 minutes with de-ionized water followed by immersion in ethylene diamine (50% in water) at 22° C. for 1 minute. The resulting sample was then rinsed for 2 minutes with de-ionized water and dried. The device (Comparative Sample 4) was completed by depositing colloidal graphite (AquaDAG) paste on the sample and drying.

Table 2 provides the surface voltage values measured for Sample 1 and Comparative Samples 1-4. As illustrated in Table 2, treatment of CdTe with $MnCl_2$ followed by $CdCl_2$ treatment and bake (Sample 1) results in higher SPV values compared to sample with no $MnCl_2$ treatment (Comparative Sample 1) and samples treated with copper salts (Comparative Samples 2-4)

TABLE 2

SPV values for Sample 1 versus Compared Samples 1-4

| Sample# | Metal Salt | SPV (milli Volts) |
|---|---|---|
| Sample 1 | $MnCl_2 \cdot 4H_2O$ | 810 |
| Comparative Sample 1 | None | 757 |
| Comparative Sample 2 | $Cu(NO_3)_2 \cdot 2.5\ H_2O$ | 744 |
| Comparative Sample 3 | CuCl in 15% HCl | 625 |
| Comparative Sample 4 | $CuCl_2 \cdot 2H_2O$ | 770 |

Example 3

Treatment of CdTe with Different Dopant Metal Salts Followed by a Cadmium Chloride ($CdCl_2$) Bake The CdTe/CdS/ZTO/FTO/glass sample of Example 1 was treated with different dopant metal salts using the process detailed in Example 2 and the treatment conditions were varied to study their effect on SPV values. Table 3 provides the details of the different metal salt treatment conditions and the SPV values measured for samples treated with zinc chloride ($ZnCl_2$), indium chloride ($InCl_3$), cobalt chloride ($CoCl_2$), chromium chloride ($CrCl_3$), sodium molybdate ($Na_2MoO_4$), and sodium tungstate ($Na_2WO_4$).

TABLE 3

Treatment conditions for different metal salts and surface voltage values

| Metal salt | Concentration (g/L) | Temperature (° C.) | Time | SPV (milli Volts) |
|---|---|---|---|---|
| $ZnCl_2$ | 100 | 65 | 10 | 804 |
| $ZnCl_2$ | 500 | 65 | 10 | 807 |
| $InCl_3$ | 50 | 65 | 10 | 810 |
| $InCl_3$ | 100 | 25 | 10 | 805 |
| $CoCl_2$ | 100 | 25 | 10 | 803 |
| $CoCl_2$ | 100 | 65 | 10 | 811 |
| $CrCl_3$ | 100 | 65 | 10 | 811 |
| $CrCl_3$ | 500 | 25 | 10 | 814 |
| $CrCl_3$ | 500 | 65 | 10 | 802 |
| $Na_2MoO_4$ | 100 | 65 | 10 | 807 |
| $Na_2MoO_4$ | 100 | 65 | 10 | 808 |
| $Na_2WO_4$ | 100 | 25 | 10 | 812 |
| $Na_2WO_4$ | 100 | 65 | 10 | 800 |
| $Na_2WO_4$ | 100 | 80 | 1 | 807 |

Figure 16A:
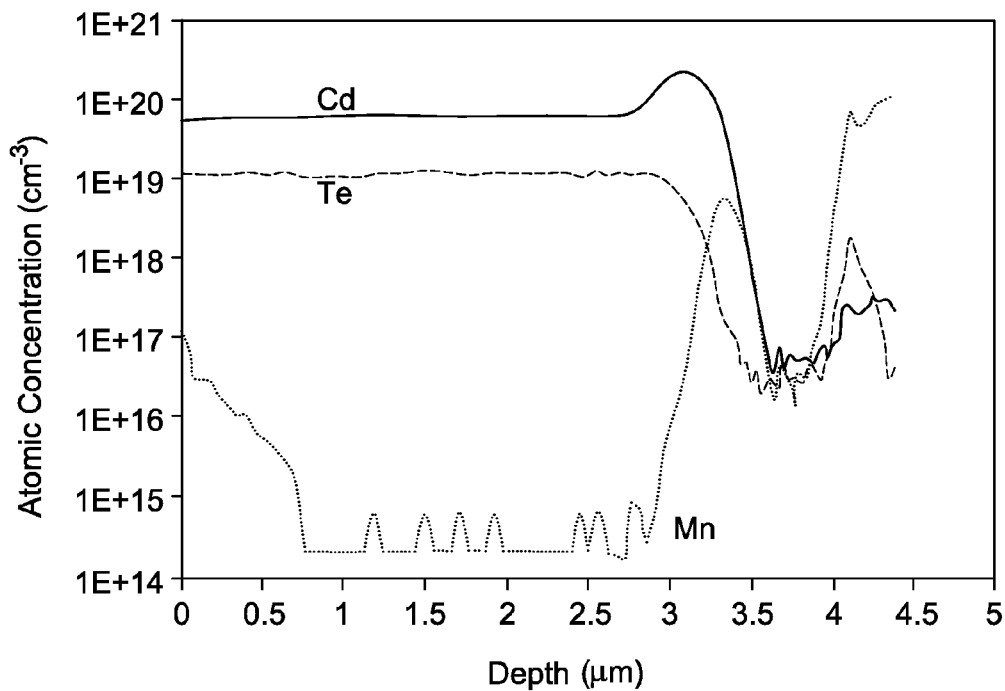
FIG. 16A is a SIMS profile of an as-deposited CdTe layer
Figure 16B:
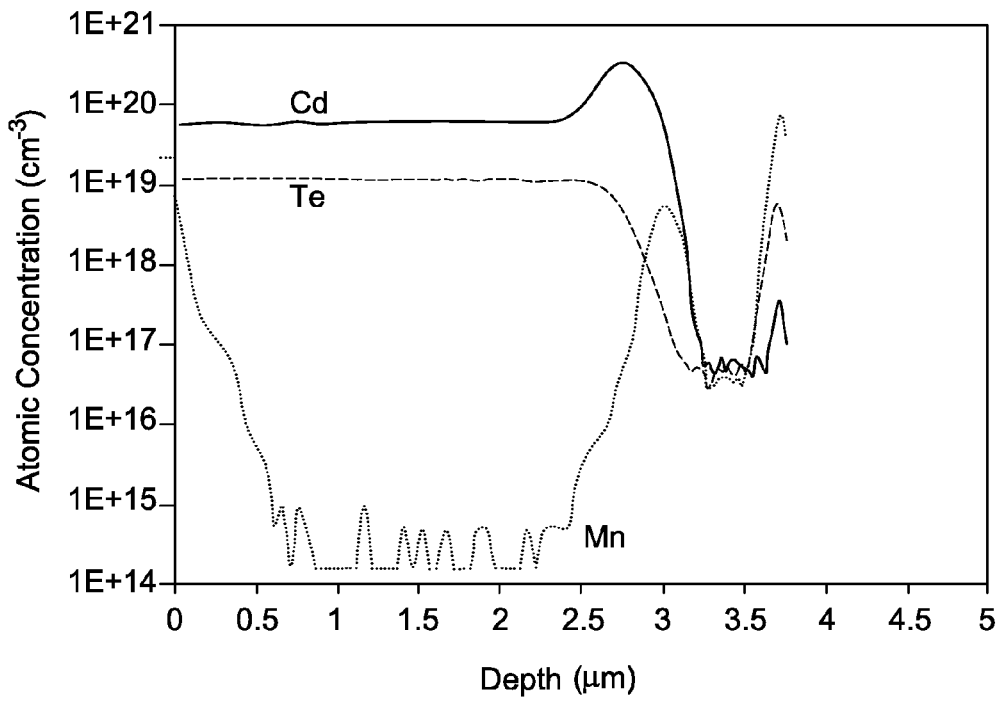
FIG. 16B is a SIMS profile of CdTe layer, in accordance with one embodiment of the invention.
Figure 17A:
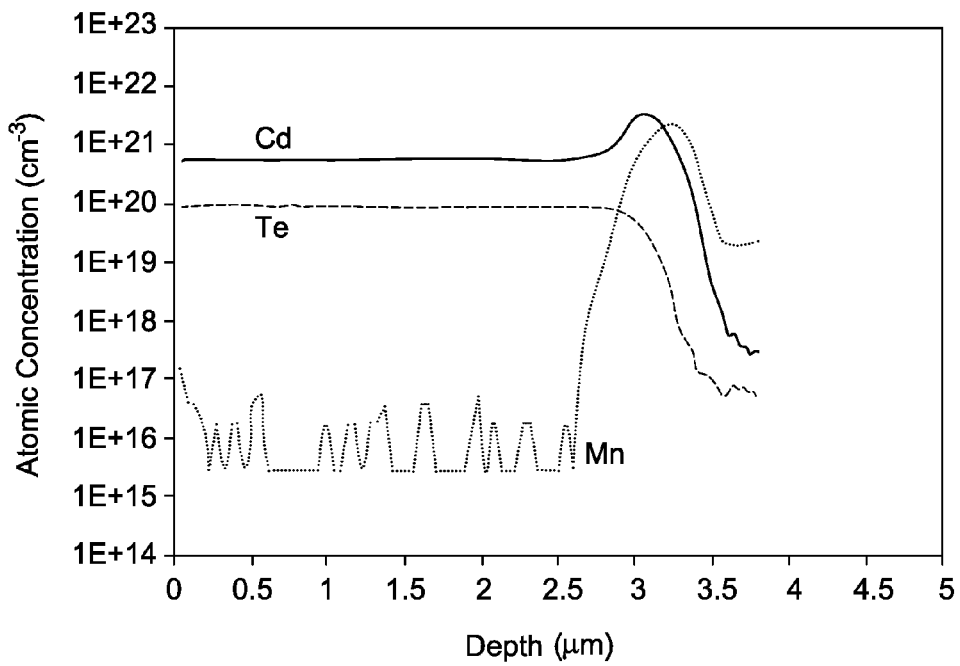
FIG. 17A is a SIMS profile of an as-deposited CdTe layer.
Figure 17B:
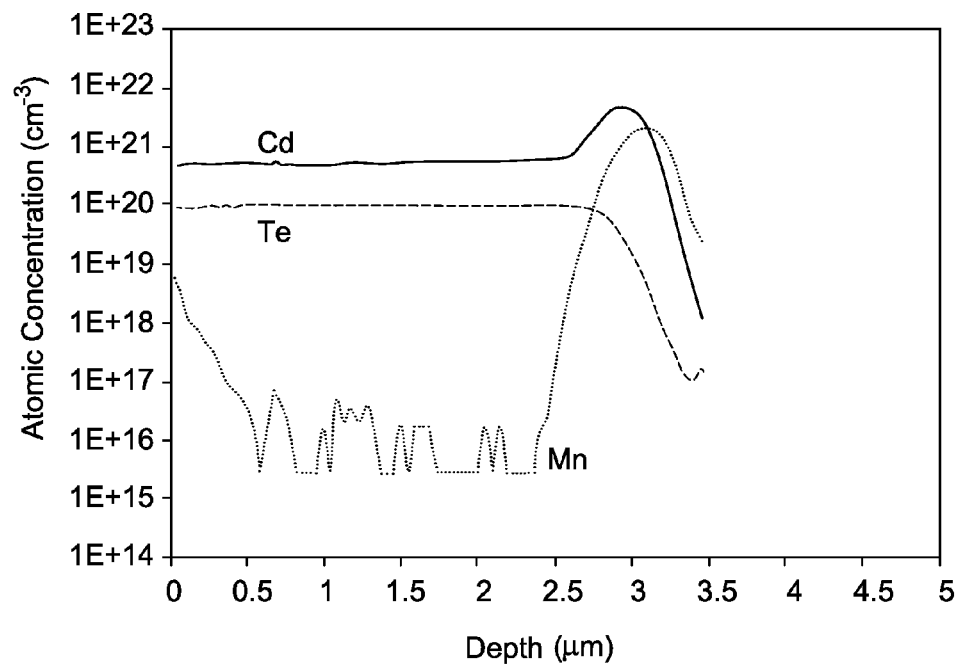
FIG. 17B is a SIMS profile of CdTe layer, in accordance with one embodiment of the invention.

Secondary ion mass spectrometry (SIMS) was used to determine the concentration profile of metal dopants in the cadmium telluride layer. FIGS. 16A and 17A show the SIMS profiles of as-deposited CdTe samples. FIGS. 16B and 17B show the SIMS profiles of CdTe samples subjected to $MnCl_2$ treatment and $ZnCl_2$ treatment, respectively as described in Examples 2 and 3. As illustrated in FIGS. 16B and 17B, the concentration of manganese or zinc in the CdTe sample increases by at least two orders of magnitude in the near back contact region (0.5 micrometers from the back contact).

Example 4

Treatment of CdTe with Cadmium Chloride ($CdCl_2$) Bake Followed by $ZnCl_2$ Treatment The CdTe/CdS/ZTO/FTO/glass sample of Example 1 was coated with $CdCl_2$ (0.1 mg/cm$^2$) and heat treated at 400° C. for 40 minutes. The $CdCl_2$ treated sample was rinsed for 2 minutes with de-ionized water followed by immersion in ethylene diamine (50% in water) at 22° C. for 1 minute. The resulting sample was then rinsed for 2 minutes with de-ionized water and dried. The resulting sample was immersed in an aqueous solution of zinc chloride ($ZnCl_2$) (500 g/L) at 70° C. for 30 minutes. The sample was then rinsed for 2 minutes with de-ionized water and dried to form Sample 2. The CdTe surface changed color. Resistivity was measured using a 4-point probe.

Example 5

Treatment of CdTe with Cadmium Chloride ($CdCl_2$) Bake Followed by $MnCl_2$ Treatment The CdTe/CdS/ZTO/FTO/glass sample of Example 1 was coated with $CdCl_2$ (0.1 mg/cm$^2$) and heat treated at 400° C. for 40 minutes. The $CdCl_2$ treated sample was rinsed for 2 minutes with de-ionized water followed by immersion in ethylene diamine (50% in water) at 22° C. for 1 minute. The resulting sample was then rinsed for 2 minutes with de-ionized water and dried. The resulting sample was immersed in an aqueous solution of manganese chloride ($MnCl_2 \cdot 4H_2O$) (500 g/L) at 65° C. for 10 minutes. The sample was then rinsed for 2 minutes with de-ionized water and dried to form Sample 3. The CdTe surface changed color. Resistivity was measured using a 4-point probe.

Comparative Example 5

Treatment of CdTe with a $CdCl_2$ Bake

The CdTe/CdS/ZnO/FTO/glass sample of Example 1 was coated with $CdCl_2$ (0.1 mg/cm$^2$) and heat treated at 400° C. for 40 minutes. The $CdCl_2$ treated sample was rinsed for 2 minutes with de-ionized water followed by immersion in ethylene diamine (50% in water) at 22° C. for 1 minute. The resulting sample was then rinsed for 2 minutes with de-ionized water and dried. Cupric acetate hydrate (0.003 mg/cm$^2$) was applied to sample followed by drying to form Comparative Sample 5.

Comparative Example 6

Treatment of CdTe with Cadmium Chloride ($CdCl_2$) Bake Followed by Copper Treatment The CdTe/CdS/ZTO/FTO/glass sample of Example 1 was coated with $CdCl_2$ (0.1 mg/cm$^2$) and heat treated at 400° C. for 40 minutes. The $CdCl_2$ treated sample was rinsed for 2 minutes with de-ionized water followed by immersion in ethylene diamine (50% in water) at 22° C. for 1 minute. The resulting sample was then rinsed for 2 minutes with de-ionized water and dried. The sample was immersed in a solution of copper nitrate, $Cu(NO_3)_2 \cdot 2.5 H_2O$ (5 g/L) at 22° C. for 1 minute. The resulting sample was then rinsed for 2 minutes with de-ionized water and dried to form Comparative Sample 6.

Comparative Example 7

Treatment of CdTe with a Copper Salt Followed by a $CdCl_2$ Bake

The CdTe/CdS/ZTO/FTO/glass sample of Example 1 was coated with $CdCl_2$ (0.1 mg/cm$^2$) and heat treated at 400° C. for 40 minutes. The $CdCl_2$ treated sample was rinsed for 2 minutes with de-ionized water followed by immersion in ethylene diamine (50% in water) at 22° C. for 1 minute. The resulting sample was then rinsed for 2 minutes with de-ionized water and dried. The sample was immersed in an aqueous solution of copper chloride, CuCl in 15% HCl (5 g/L) at 22° C. for 1 minute. The resulting sample was then rinsed for 2 minutes with de-ionized water and dried to form Comparative Sample 7.

Table 4 provides the resistivity values measured for Samples 2 and 3 and Comparative Samples 5-7. As illustrated in Table 4, treatment of CdTe with cadmium chloride and bake followed by metal salt treatment (Sample 2 and 3) results in lower resistivity values compared to sample with no $MnCl_2$ treatment (Comparative Sample 5).

TABLE 4

Resistivity values for Samples 2 and 3 versus Comparative Samples 5-7

| Sample# | Metal Salt | Resistivity (Ohms/square) |
| --- | --- | --- |
| Sample 2 | $ZnCl_2$ | $1 \times 10^6$ |
| Sample 3 | $MnCl_2 \cdot 4H_2O$ | $1 \times 10^6$ |
| Comparative Sample 5 | None | $1 \times 10^8$ |
| Comparative Sample 6 | $Cu(NO_3)_2 \cdot 2.5 H_2O$ | $1 \times 10^2$ |
| Comparative Sample 7 | CuCl in 15% HCl | $1 \times 10^5$ |

Figure 18A:
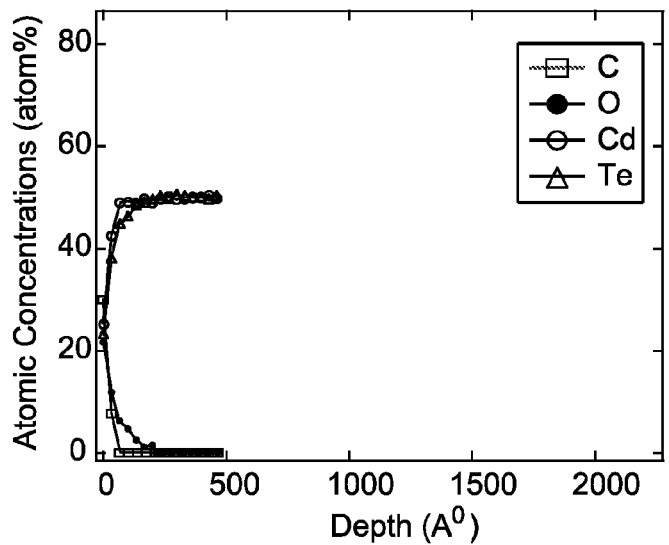
FIG. 18A is an XPS profile of as-deposited CdTe layer.
Figure 18B:
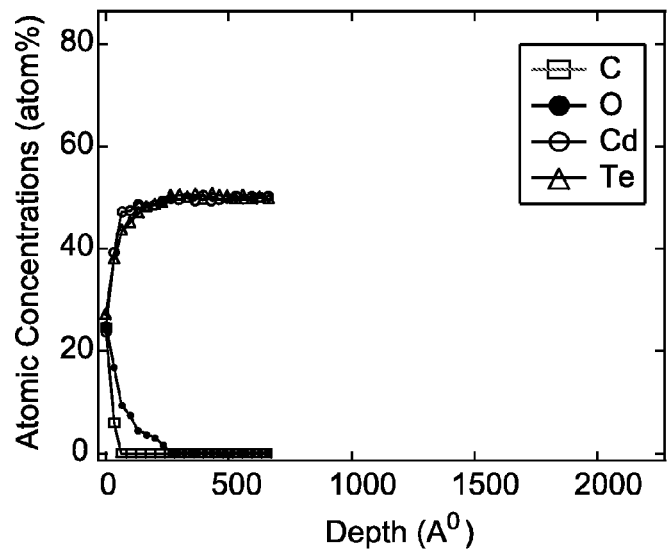
FIG. 18B is an XPS profile of CdTe layer treated with $CdCl_2$ and baked.
Figure 18C:
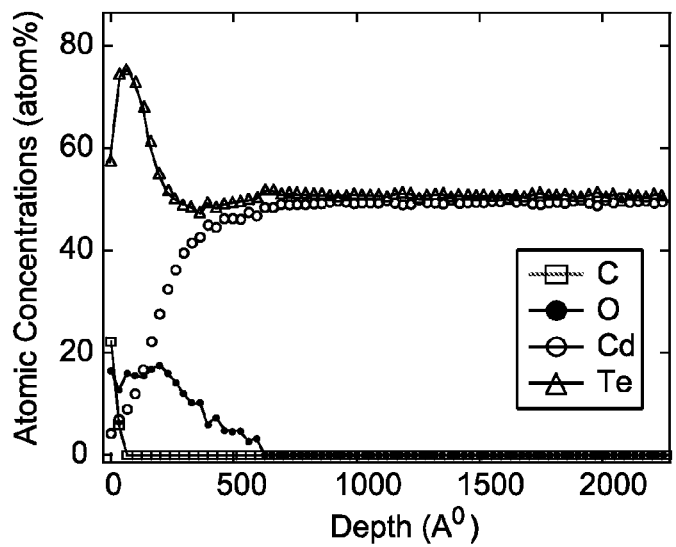
FIG. 18C is an XPS profile of CdTe layer, in accordance with one embodiment of the invention.
Figure 19:
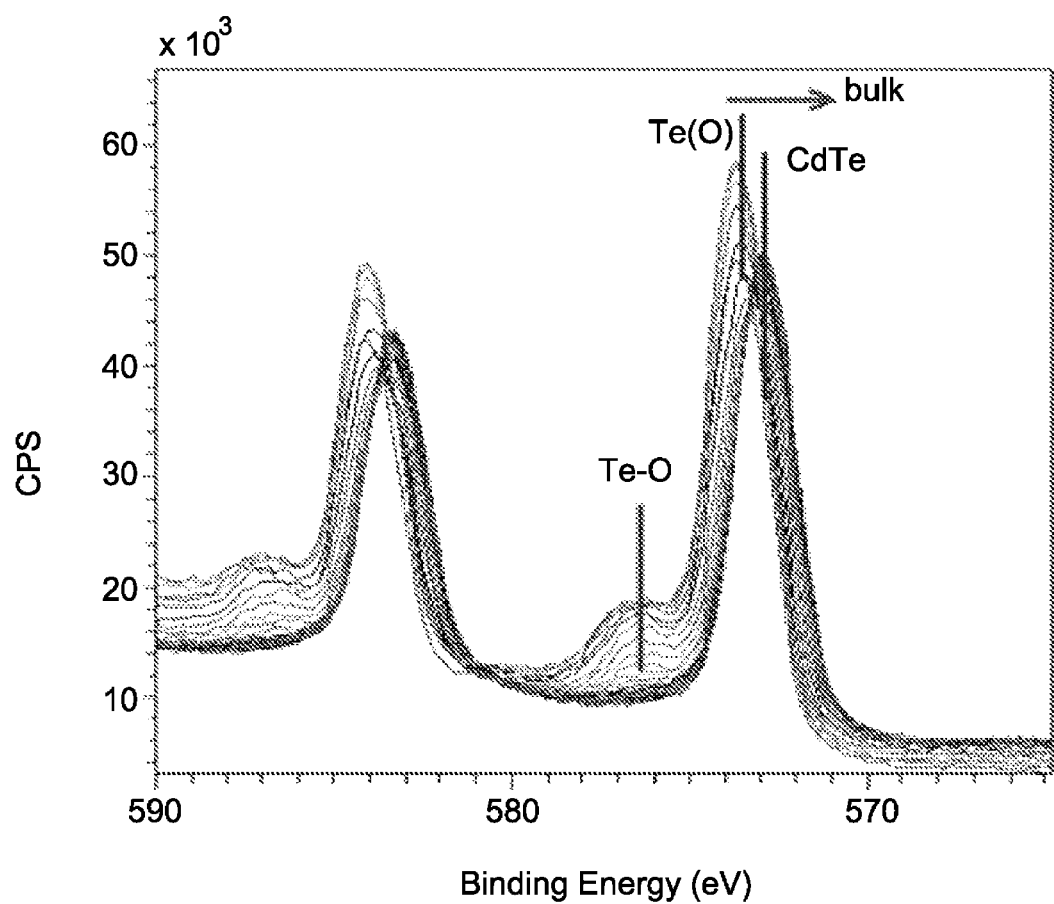
FIG. 19 is an XPS profile of CdTe layer, in accordance with one embodiment of the invention.
Figure 20A:
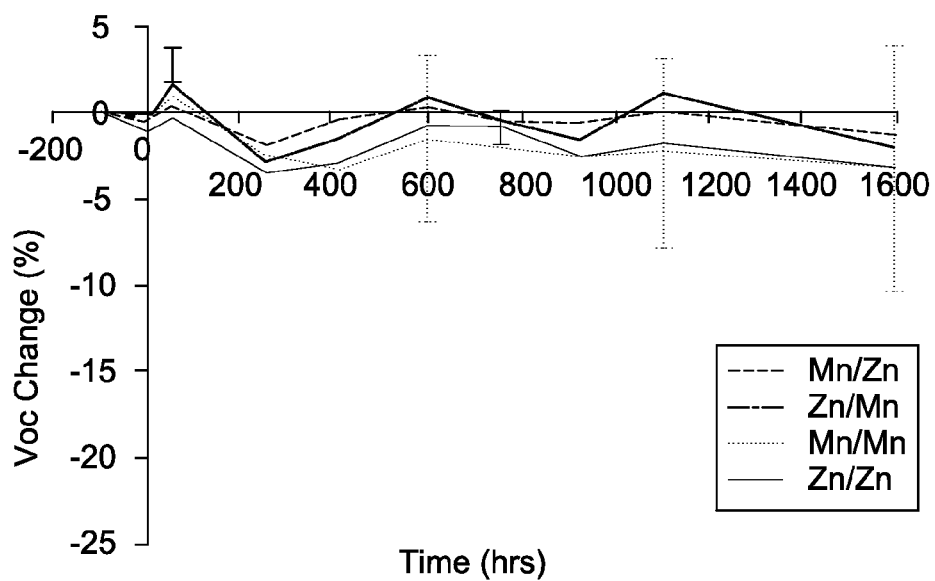
FIG. 20A shows the accelerated life testing (ALT) $V_{OC}$ data for samples prepared in accordance with one embodiment of the invention.
Figure 20B:
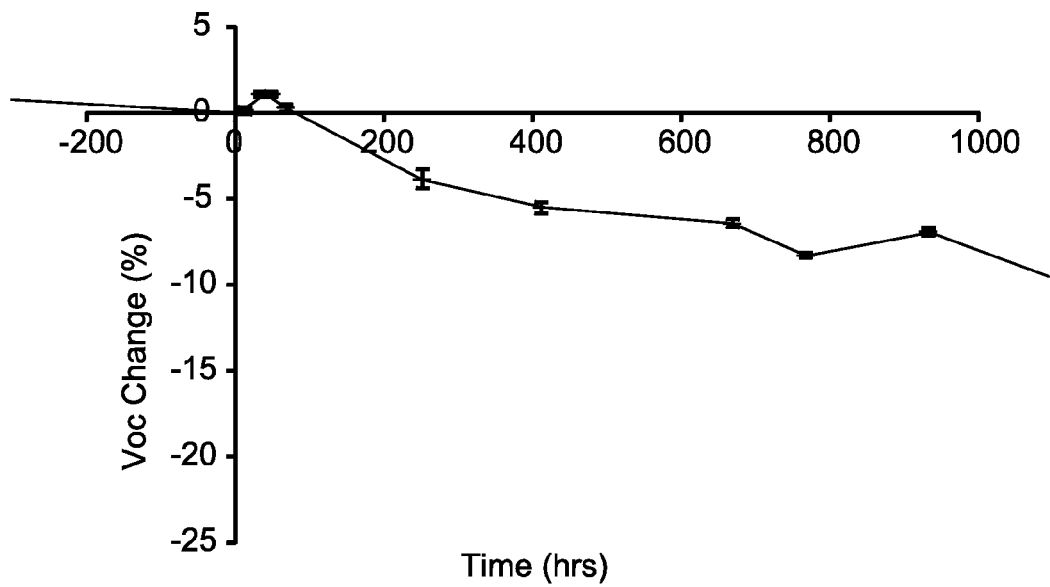
FIG. 20B shows the accelerated life testing (ALT) $V_{OC}$ data for a comparative sample.
Figure 21A:
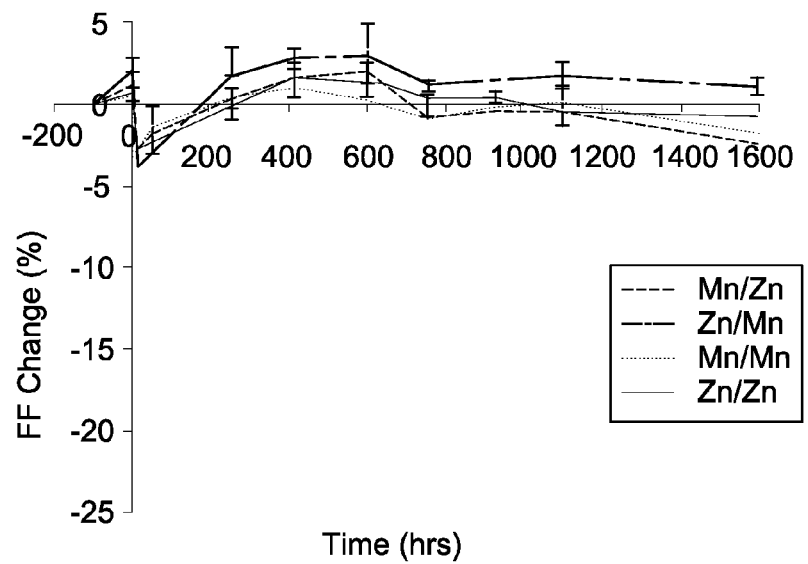
FIG. 21A shows the accelerated life testing (ALT) FF data for samples prepared in accordance with one embodiment of the invention.
Figure 21B:
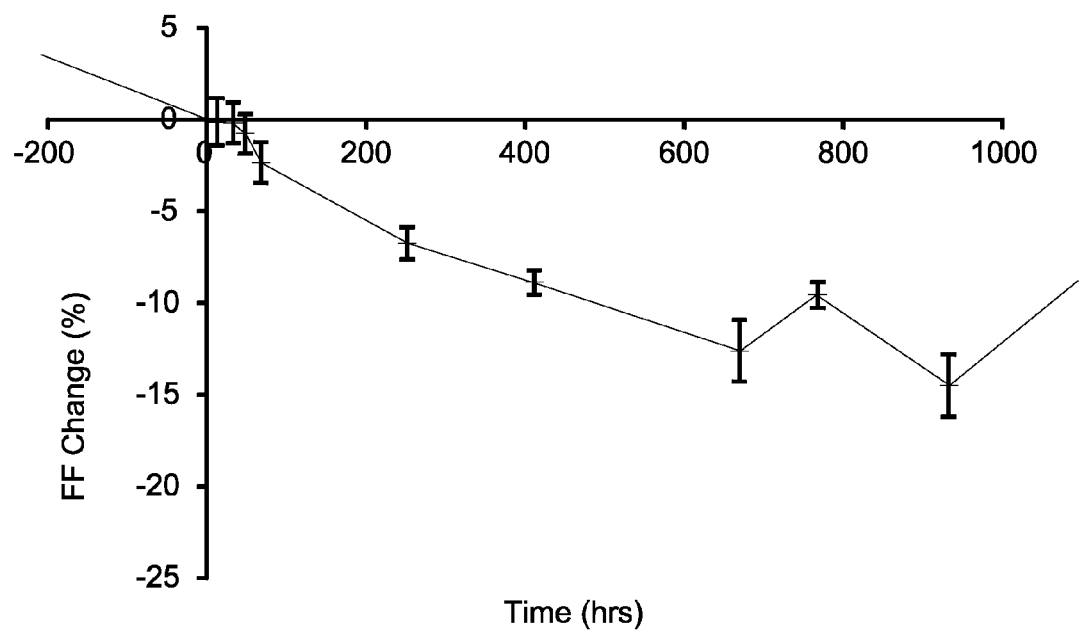
FIG. 21B shows the accelerated life testing (ALT) FF data for a comparative sample.
Figure 22A:
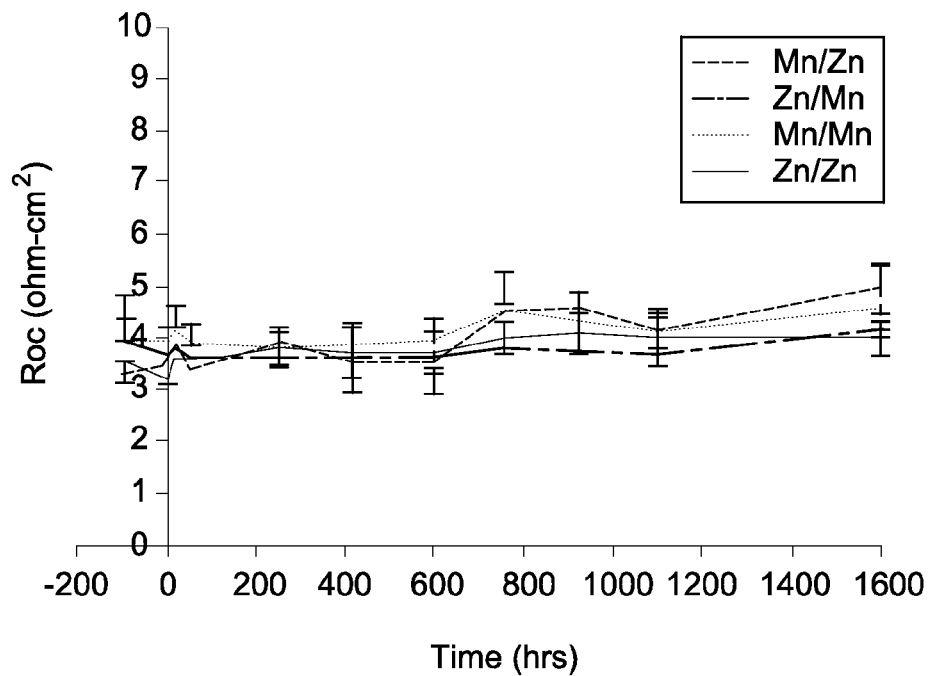
FIG. 22A shows the accelerated life testing (ALT) $R_{OC}$ data for samples prepared in accordance with one embodiment of the invention.
Figure 22B:
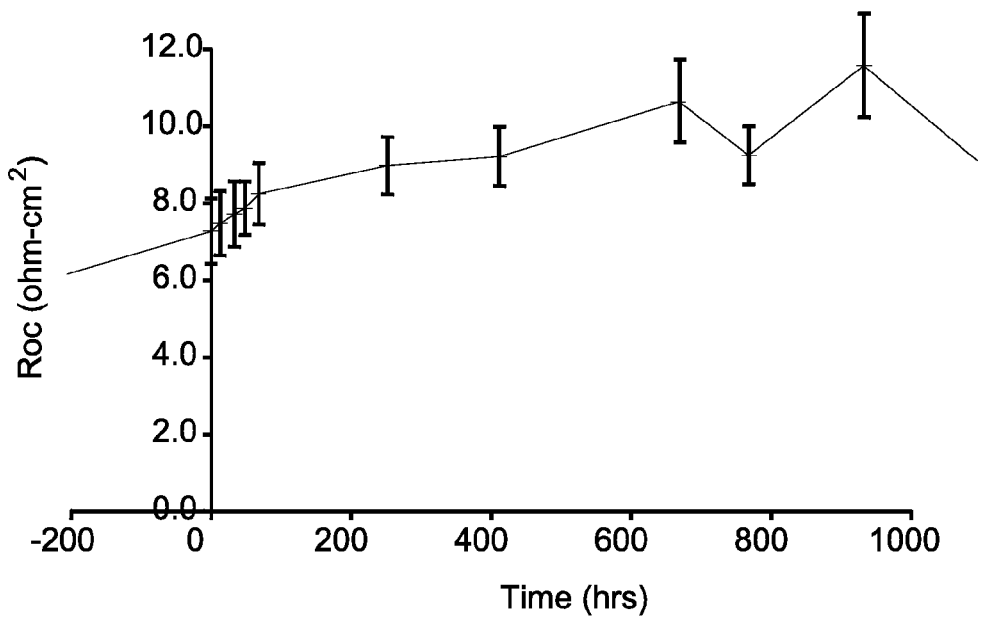
FIG. 22B shows the accelerated life testing (ALT) $R_{OC}$ data for a comparative sample.

X-ray photoelectron spectroscopy (XPS) was used to determine the concentration profile of metal dopants in the interfacial layer formed in Example 4 and Comparative Examples 6-7. Table 5 shows the atomic concentration of the metal in the interfacial layer and the depth at which the metal was observable. FIG. 18A shows the XPS profile of as-deposited CdTe layer, FIG. 18B shows the XPS profile of CdTe layer treated with $CdCl_2$ and baked, and FIG. 18C shows the XPS profile of CdTe layer treated with $CdCl_2$ bake followed by $ZnCl_2$ treatment. As illustrated in FIG. 18C, cadmium was depleted and tellurium was enriched near the surface of the CdTe layer. FIG. 19 further shows an elemental tellurium enriched surface layer

TABLE 5

X-ray photoelectron spectroscopy (XPS) data
for Sample 2 versus Comparative Samples 5-7

| Sample# | Atomic concentration of metal telluride at CdTe Surface (%) | Depth of of observable metal telluride (nm) |
|---|---|---|
| Sample 2 | 1 | <5 |
| Comparative Sample 6 | 1 | 10 |
| Comparative Sample 7 | 1 | 45 |

Example 6

Treatment of CdTe with $MnCl_2$ Followed by Cadmium Chloride ($CdCl_2$) Bake Followed by $MnCl_2$ Treatment The CdTe/CdS/ZTO/FTO/glass sample of Example 1 was immersed in a solution of manganese chloride ($MnCl_2.4H_2O$) (500 g/L) (first metal salt) at 22° C. for 10 minutes. The sample was then rinsed for 2 minutes with de-ionized water and dried. The dried sample was coated with $CdCl_2$ (0.1 mg/cm$^2$) and heat treated at 400° C. for 40 minutes. The $CdCl_2$ treated sample was rinsed for 2 minutes with de-ionized water followed by immersion in ethylene diamine (50% in water) at 22° C. for 1 minute. The resulting sample was then rinsed for 2 minutes with de-ionized water and dried. The resulting sample was immersed in a solution of manganese chloride ($MnCl_2.4H_2O$) (500 g/L) (second metal salt) at 65° C. for 10 minutes. The sample was then rinsed for 2 minutes with de-ionized water and dried. The device (Sample 4) was completed by depositing 100 nm layer of molybdenum and 100 nm layer of aluminum.

Similar to Sample 4, devices using different combinations of first and second metals were prepared corresponding to Mn/Mn (Sample 4), Mn/Zn (Sample 5), Zn/Mn (Sample 6), and Zn/Zn (Sample 7). As used herein, Mn/Zn means that the first metal salt includes manganese and second metal salt includes zinc.

Comparative Example 8

Treatment of CdTe with a $CdCl_2$ Bake

The CdTe/CdS/ZnO/FTO/glass sample of Example 1 was coated with $CdCl_2$ (0.1 mg/cm$^2$) and heat treated at 400° C. for 40 minutes. The $CdCl_2$ treated sample was rinsed for 2 minutes with de-ionized water followed by immersion in ethylene diamine (50% in water) at 22° C. for 1 minute. The resulting sample was then rinsed for 2 minutes with de-ionized water and dried. Cupric acetate hydrate (0.003 mg/cm$^2$) was applied to the sample at 200 C for 18 minutes. The device (Comparative Sample 8) was completed by depositing 100 nm layer of gold.

Comparative Example 9

Treatment of CdTe with a $CdCl_2$ Bake

The CdTe/CdS/ZnO/FTO/glass sample of Example 1 was coated with $CdCl_2$ (0.1 mg/cm$^2$) and heat treated at 400° C. for 40 minutes. The $CdCl_2$ treated sample was rinsed for 2 minutes with de-ionized water followed by immersion in ethylene diamine (50% in water) at 22° C. for 1 minute. The resulting sample was then rinsed for 2 minutes with de-ionized water and dried. Cupric acetate hydrate (0.003 mg/cm$^2$) was applied to the sample at 200° C. for 18 minutes. The device (Comparative Sample 9) was completed by depositing microns of graphite at 150° C. for 14 minutes followed by depositing 20 nm layer of nickel and 100 nm layer of aluminum.

FIGS. 20A-22A show the accelerated life testing (ALT) data for Samples 4-7. FIGS. 20B-22B show the accelerated life testing (ALT) data for Comparative Sample 9. As illustrated, the samples treated with metal salts show better device stability when compared with copper-treated device.

Table 6 provides the open circuit voltage ($V_{OC}$), open circuit resistance ($R_{OC}$), and efficiency values measured for devices prepared using the process of Example 6.

TABLE 6

Performance parameters for photovoltaic devices prepared
by treatment with first metal salt followed by $CdCl_2$ bake
followed by second metal salt treatment.

| First metal | Second metal | $V_{oc}$ (milliV) | $R_{oc}$ (ohm) | Efficiency (%) |
|---|---|---|---|---|
| Co | Mn | 823 | 5.3 | 10.50 |
| Cr | Mn | 796 | 5.3 | 11.32 |
| Mn | Co | 805 | 4.8 | 11.56 |
| Mn | Ni | 809 | 5.6 | 11.19 |
| Mn | Mn | 820 | 4.5 | 11.63 |
| Mn | Zn | 813 | 3.4 | 12.47 |
| Zn | Mn | 797 | 3.2 | 12.53 |
| Zn | Zn | 802 | 3.4 | 12.48 |

The appended claims are intended to claim the invention as broadly as it has been conceived and the examples herein presented are illustrative of selected embodiments from a manifold of all possible embodiments. Accordingly, it is the Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of:" Where necessary, ranges have been supplied; those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

The invention claimed is:

1. A method of making a photovoltaic device, comprising:
 disposing an absorber layer on a window layer;
 treating at least a portion of the absorber layer with a first solution comprising a first metal salt to form a first component,
  wherein the first metal salt comprises a first metal selected from the group consisting of manganese, cobalt, chromium, zinc, indium, tungsten, molybdenum, and combinations thereof;
 treating at least a portion of the first component with cadmium chloride to form a second component;
 treating at least a portion of the second component with a second solution comprising a second metal salt to form an interfacial layer on the second component, wherein the second metal salt comprises a second metal selected from the group consisting of manganese, cobalt, nickel, zinc, and combinations thereof.

2. The method of claim 1, wherein the first metal and the second metal are different.

3. The method of claim 1, wherein the first metal and the second metal are the same.

4. The method of claim 1, wherein the first metal salt comprises manganese or zinc.

5. The method of claim 1, wherein the second metal salt comprises manganese or zinc.

6. The method of claim 1, wherein the first metal salt comprises a first metal chloride and the second metal salt comprises a second metal chloride.

7. The method of claim 1, wherein forming the second component comprises doping the absorber layer with the first metal.

8. The method of claim 1, wherein the first metal salt is present in the first solution at a concentration in a range from about 50 g/L to about 1000 g/L.

9. The method of claim 1, wherein treating at least a portion of the absorber layer with the first solution comprises a soaking treatment.

10. The method of claim 1, wherein treating at least a portion of the doped absorber layer with cadmium chloride further comprises a heating treatment.

11. The method of claim 1, wherein forming the interfacial layer comprises forming a telluride of the second metal in the interfacial layer.

12. The method of claim 1, wherein treating at least a portion of the second component with a second solution comprises a soaking treatment.

13. The method of claim 1, wherein the second metal is present in the interfacial layer at a concentration in a range less than about 1 atomic percent of the interfacial layer.

14. The method of claim 1, wherein the interfacial layer has a thickness in a range from about 1 nanometer to about 10 nanometers.

15. The method of claim 1, wherein the absorber layer comprises cadmium telluride, cadmium zinc telluride, cadmium sulfur telluride, cadmium manganese telluride, cadmium magnesium telluride, or combinations thereof.

16. The method of claim 1, wherein the window layer comprises cadmium sulfide, cadmium selenide, oxygenated cadmium sulfide, zinc telluride, zinc selenide, zinc sulfide, indium selenide, indium sulfide, zinc oxihydrate, or combinations thereof.

17. The method of claim 1, further comprising:
disposing a transparent layer on a support, and
disposing the window layer on the transparent layer.

18. The method of claim 17, further comprising disposing a back contact layer on the interfacial layer to form the photovoltaic device.

19. The method of claim 1, wherein the photovoltaic device has an open circuit voltage in a range greater than about 800 mV.

20. The method of claim 1, wherein the photovoltaic device has an open circuit resistance in a range less than about 4 ohm-cm$^{-2}$.

* * * * *